US012707594B2

(12) United States Patent
Lin et al.

(10) Patent No.: US 12,707,594 B2
(45) Date of Patent: Aug. 11, 2026

(54) LIQUID COOLING HEAT EXCHANGE CASING

(71) Applicant: Cooler Master Co., Ltd., Taipei City (TW)

(72) Inventors: Tsung-Wei Lin, Taipei City (TW); Shui-Fa Tsai, Taipei City (TW)

(73) Assignee: Cooler Master Co., Ltd., Taipei City (TW)

(*) Notice: Subject to any disclaimer, the term of this patent is extended or adjusted under 35 U.S.C. 154(b) by 639 days.

(21) Appl. No.: 18/194,640

(22) Filed: Apr. 2, 2023

(65) Prior Publication Data

US 2023/0328925 A1 Oct. 12, 2023

(30) Foreign Application Priority Data

Apr. 7, 2022 (TW) ................................ 111203488

(51) Int. Cl.
*H05K 7/20* (2006.01)

(52) U.S. Cl.
CPC ..... *H05K 7/20272* (2013.01); *H05K 7/20172* (2013.01); *H05K 7/20254* (2013.01); *H05K 7/20263* (2013.01)

(58) Field of Classification Search
CPC ....... F28D 2001/026; F28D 2001/0266; F28D 2001/0417; F28D 2001/0426;

(Continued)

(56) References Cited

U.S. PATENT DOCUMENTS 4,202,296 A * 5/1980 Nonnenmann ..... F04D 29/4213 415/206
6,363,892 B1 * 4/2002 Zobel .................... F04D 29/626 123/41.12

(Continued)

FOREIGN PATENT DOCUMENTS

CN 201084093 Y 7/2008
CN 107844176 A 3/2018

OTHER PUBLICATIONS

First Office Action issued in corresponding Chinese Patent Application No. 202210433310.7 dated May 21, 2025, with English translation (16 pages).

(Continued)

*Primary Examiner* — Eric S Ruppert
*Assistant Examiner* — Hans R Weiland
(74) *Attorney, Agent, or Firm* — Merchant & Gould P.C

(57) ABSTRACT

A liquid cooling heat exchange casing including a chassis having a first side is provided. The first side includes a first inlet flow passageway system having a first inlet liquid coolant opening, a first outlet flow passageway system having a first outlet liquid coolant opening, a plurality of adapters, and at least one radiator. The at least one radiator is mounted to the first inlet flow passageway system via a radiator inlet and one of the plurality of adapters and to the first outlet flow passageway system via a radiator outlet and another of the plurality of adapters. A cooling fluid flows from the first inlet liquid coolant opening, through the first inlet flow passageway system, through the at least one radiator, and through the first outlet flow passageway system, to the first outlet liquid coolant opening, before being circulated to repeat the flow process again.

18 Claims, 12 Drawing Sheets

(58) Field of Classification Search
CPC ...... F28D 2001/0435; F28D 2001/044; H05K 7/20172; H05K 7/20254; H05K 7/2026; H05K 7/20272
See application file for complete search history.

(56) References Cited

U.S. PATENT DOCUMENTS 10,874,034 B1 * 12/2020 Chen .................... H01L 23/473
11,085,439 B2 * 8/2021 Pawlick ................. F04B 47/00
2002/0023738 A1 * 2/2002 Ehlers ..................... F01P 11/04 165/125
2006/0081363 A1 * 4/2006 Chissus ................ F28D 1/0435 165/173
2007/0256817 A1 * 11/2007 Toda ...................... F28F 9/001 165/143
2011/0272120 A1 * 11/2011 Joshi ...................... F28D 15/00 165/104.13
2012/0018139 A1 * 1/2012 Chen ...................... F28F 9/262 165/200
2014/0202669 A1 * 7/2014 Kulesza ................ B60K 11/04 165/148
2016/0146551 A1 * 5/2016 Kolb .................... F28D 1/0417 165/173
2017/0356680 A1 * 12/2017 Annapragada .......... F25B 21/00
2019/0104641 A1 * 4/2019 Fan .......................... G06F 1/20
2020/0166976 A1 * 5/2020 Lin ...................... G06F 1/1632
2020/0191042 A1 * 6/2020 Sabate .............. H05K 7/20218
2021/0280925 A1 * 9/2021 Yoshinori ......... H01M 10/6569
2021/0286242 A1 * 9/2021 Liu ....................... G03B 21/16
2022/0346282 A1 * 10/2022 Chen ................. H05K 7/20272

OTHER PUBLICATIONS

Second Office Action issued in corresponding Chinese Patent Application No. 202210433310.7 dated Nov. 11, 2025, with English translation (17 pages).

* cited by examiner

16A

LIQUID COOLING HEAT EXCHANGE CASING

RELATED APPLICATIONS

This US application claims the benefit of priority to Taiwan application no. 111203488, filed on Apr. 7, 2022, of which is incorporated herein by reference in its entirety.

TECHNICAL FIELD

Example embodiments relate generally to the field of heat dissipation and, more particularly, to liquid cooling heat exchange casings for mounting and disengagement of substrates, electronic components, and heat exchange apparatuses to the substrates or electronic components.

BACKGROUND

With the increase of the processing speed and performance of electronic components, such as central processing units (CPUs), the amount of heat generated during operation of the electronic component increases. The heat generation increases the temperature of the electronic component and, if the heat cannot be dissipated effectively, reliability and performance of the electronic component are reduced. To prevent overheating of an electronic component, typically, a liquid cooling apparatus is used for cooling the electronic component and thereby maintaining normal operation of the electronic component.

Existing liquid cooling apparatuses typically include a base plate of a heat exchange chamber attached to a CPU or GPU, as an example, and the heat exchange chamber is fluidly connected to a fluid circulating pump. As an example, all-in-one (AIO) liquid coolers, are third party liquid cooling systems, typically combining the base plate and heat exchange chamber and pump all-in-one, dissipating heat from one heat source. A reservoir, a radiator, and fans, may also be added to the liquid cooing systems. As another example, custom loop liquid cooling systems, are custom built, offering greater flexibility for users in the specifications of the apparatuses or devices used in the liquid cooling system, dissipating heat from one or more than one heat source. For both liquid cooling systems, risk of leakage due to pressure inside of tubes is always present due to the heat absorbed by the liquid coolant from the heat source. The greater the length of the tubes required, the greater the risk of leakage. Furthermore, when a radiator is mounted in the cases, bent tubes will reduce waterflow and decrease cooling performance. The greater the length of the tubes required, the greater the risk of bent tubes or worst, kinked tubes. Meanwhile, for AIO liquid coolers, installation is dependent on the design of each case, offering one or two fixed set-ups for a user to choose. While more than one set-up option may be available for custom liquid cooling systems, installation is still dependent on the design of each case. For both liquid cooling systems, installation and set-up of the most efficient cooling performance is challenging, limited by the availability of non-customizable cases. Furthermore, generally, one to two radiators may be mounted in a case. Thus, cooling capacity is limited, hindering more powerful electronic component system set-ups.

Tube leaks and any liquid cooling system leaks may cause an electronic component system to crash and fail. Bent and kinked tubes reduces waterflow and decreases cooling performance. Decreased heat transfer efficiency due to bent tubes, kinked tubes, or inefficient set-ups, or limited cooling capacity for a more powerful electronic component system, may cause a CPU or GPU to overheat, also causing an electronic component system to crash and fail.

SUMMARY

Various aspects of the present disclosure provide a liquid cooling heat exchange casing for mounting and disengagement of substrates, electronic components, and heat exchange apparatuses to the substrates or electronic components.

According to one aspect of the present disclosure, a liquid cooling heat exchange casing, including a chassis having at least a first side is provided. The at least a first side includes a first inlet flow passageway system, a first outlet flow passageway system, a plurality of adapter, and at least one radiator. The first inlet flow passageway system has a first inlet liquid coolant opening and a first inlet flowthrough opening and the first outlet flow passageway system has a first outlet liquid coolant opening and a first outlet flowthrough opening. The at least one radiator includes a radiator inlet portion and a radiator outlet portion. The radiator inlet portion has a radiator inlet and the radiator outlet portion has a radiator outlet. One of the plurality of adapters is mounted to the first inlet flowthrough opening. The at least one radiator is at least mounted to the first inlet flow passageway system via the radiator inlet and the one of the plurality of adapters. The at least one radiator is in fluid communication with the first inlet flow passageway system. Another of the plurality of adapters is mounted to the first outlet flowthrough opening. The at least one radiator is at least mounted to the first outlet flow passageway system via the radiator outlet and the another of the plurality of adapters. The at least one radiator is in fluid communication with the first outlet flow passageway system. The cooling fluid flows from the first inlet liquid coolant opening, through the first inlet flow passageway system, through the at least one radiator, through the first outlet flow passageway system, and to the first outlet liquid coolant opening, before being circulated to repeat the flow process again.

According to another aspect of the present disclosure, the liquid cooling heat exchange casing further includes a pump. The pump is configured to circulate liquid coolant via the first outlet liquid coolant opening and the first inlet liquid coolant opening.

According to yet another aspect of the present disclosure, the liquid cooling heat exchange casing further includes at least a liquid plate heat exchanger and at least a heat source. The at least a liquid plate heat exchanger is in fluid communication with the pump. The at least a liquid plate heat exchanger is configured to transfer heat from the heat source.

According to another aspect of the present disclosure, the chassis further includes a second side, next to the at least a first side. The second side includes a second inlet flow passageway system, a second outlet flow passageway system, and a second radiator. The second inlet flow passageway system has a second inlet transition opening and a second inlet flowthrough opening. The second outlet flow passageway system has a second outlet transition opening and a second outlet flowthrough opening. The second radiator includes a second radiator inlet portion and a second radiator outlet portion. The second inlet radiator portion has a second radiator inlet and the second radiator outlet portion has a second radiator outlet. Yet another of the plurality of adapters is mounted to the second inlet flowthrough opening, and the second radiator is at least mounted to the second inlet flow passageway system via the second radiator inlet and the yet another of the plurality of adapters. The second radiator is in fluid communication with the second inlet flow passageway system. Further yet another of the plurality of adapters is mounted to the second outlet flowthrough opening, and the second radiator is at least mounted to the second outlet flow passageway system via the second radiator outlet and the further yet another of the plurality of adapters. The second radiator is in fluid communication with the second outlet flow passageway system. The first inlet flow passageway system is in fluid communication with the second inlet flow passageway system via the second inlet transition opening and the second outlet flow passageway system is in fluid communication with the first outlet flow passageway system via the second outlet transition opening, whereby the cooling fluid further flows from the first inlet flow passageway system, through the second inlet flow passageway system, through the second radiator, through the second outlet flow passageway system, and to the first outlet flow passageway system.

According to another aspect of the present disclosure, the chassis further includes a third side. The third side includes a third inlet flow passageway system, a third outlet flow passageway system, and a third radiator. The third inlet flow passageway system has a third inlet transition opening and a third inlet flowthrough opening. The third outlet flow passageway system has a third outlet transition opening and a third outlet flowthrough opening. The third radiator includes a third radiator inlet portion and a third radiator outlet portion. The third inlet radiator portion has a third radiator inlet and the third radiator outlet portion has a third radiator outlet. Yet another of the plurality of adapters is mounted to the third inlet flowthrough opening, and the third radiator is at least mounted to the third inlet flow passageway system via the third radiator inlet and the yet another of the plurality of adapters. The third radiator is in fluid communication with the third inlet flow passageway system. Further yet another of the plurality of adapters is mounted to the third outlet flowthrough opening, and the third radiator is at least mounted to the third outlet flow passageway system via the third radiator outlet and the further yet another of the plurality of adapters. The third radiator is in fluid communication with the third outlet flow passageway system. The second inlet flow passageway system is in fluid communication with the third inlet flow passageway system via the third inlet transition opening. The third outlet flow passageway system is in fluid communication with the second outlet flow passageway system. The cooling fluid further flows from the second inlet flow passageway system, through the third inlet flow passageway system, through the third radiator, through the third outlet flow passageway system, and to the second outlet flow passageway system.

According to further yet another aspect of the present disclosure, the third inlet flow passageway system further includes a third inlet opening and the third outlet flow passageway system further includes a third outlet opening. Additionally, the liquid cooling heat exchange casing further includes a second liquid plate heat exchanger and a second heat source. The cooling fluid is further circulated via the third outlet opening and the third inlet opening, and the second liquid plate heat exchanger is configured to transfer heat from the second heat source.

According to another aspect of the present disclosure, the chassis further includes a fourth side, next to the third side. The fourth side includes a fourth inlet flow passageway system, a fourth outlet flow passageway system, and a fourth radiator. The fourth inlet flow passageway system has a fourth inlet opening and a fourth inlet flowthrough opening. The fourth outlet flow passageway system has a fourth outlet opening and a fourth outlet flowthrough opening. The fourth radiator includes a fourth radiator inlet portion and a fourth radiator outlet portion. The fourth inlet radiator portion has a fourth radiator inlet and the fourth radiator outlet portion has a fourth radiator outlet. Yet another of the plurality of adapters is mounted to the fourth inlet flowthrough opening, and the fourth radiator is at least mounted to the fourth inlet flow passageway system via the fourth radiator inlet and the yet another of the plurality of adapters. The fourth radiator is in fluid communication with the fourth inlet flow passageway system. Further yet another of the plurality of adapters is mounted to the fourth outlet flowthrough opening, and the fourth radiator is at least mounted to the fourth outlet flow passageway system via the fourth radiator outlet and the further yet another of the plurality of adapters. The fourth radiator is in fluid communication with the fourth outlet flow passageway system. The first inlet flow passageway system is in fluid communication with the fourth inlet flow passageway system and the fourth outlet flow passageway system is in fluid communication with the first outlet flow passageway system, whereby the cooling fluid further flows from the first inlet flow passageway system, through the fourth inlet flow passageway system, through the fourth radiator, through the fourth outlet flow passageway system, and to the first outlet passageway system.

According to yet another aspect of the present disclosure, the chassis further includes a plurality of transition liquid conduits and a mounting system. The first inlet flow passageway system is in fluid communication with the fourth inlet flow passageway system via the plurality of transition liquid conduits and the fourth outlet flow passageway system is in fluid communication with the first outlet flow passageway system via the plurality of transition liquid conduits. The mounting system includes at least a mounting plate, an expansion card slot, and a plurality of fastener holes. The at least a mounting plate is mounted to the plurality of fastener holes disposed on at least two of the plurality of transition liquid conduits, and the expansion card slot is disposed on at least two of the plurality of transition liquid conduits, and the mounting system is configured to mount at least one of a motherboard, an expansion card, a pump, a reservoir, a liquid plate heat exchanger, a heat source, an electronic component or any combination of the foregoing, thereto.

According to further yet another aspect of the present disclosure. In addition to the plurality of transition liquid conduits, the chassis further includes a plurality of liquid conduit splitters, a plurality of corner flow connectors, a plurality of liquid conduits, a plurality of transition flow connectors, and a plurality of elongated structures. Each of the plurality of liquid conduit splitters is configured for fluid to flow in two separate flow directions via a dividing panel. Each of the plurality of corner flow connectors is configured for fluid to flow in at least one flow direction. Each of the plurality of liquid conduits is configured for fluid to flow therethrough. Each of the plurality of transition flow connectors is configured for fluid to flow in at least one flow direction. Each of the plurality of transition liquid conduits is configured for fluid to flow therethrough.

According to another aspect of the present disclosure, the first inlet flow passageway system further includes one of the plurality of corner flow connectors, one of the plurality of liquid conduits, and one of the plurality of transition flow connectors having the first inlet flowthrough opening. The one of the plurality of corner flow connectors in fluid communication with the one of the plurality of liquid conduits. The one of the plurality of liquid conduits is in fluid communication with the one of the plurality of transition flow connectors. The first outlet flow passageway system further includes another of the plurality of transition flow connectors having the first outlet flowthrough opening, another of the plurality of liquid conduits, and another of the plurality of corner flow connectors. The another of the plurality of corner flow connectors is in fluid communication with the plurality of liquid conduits. The another of the plurality of liquid conduits in fluid communication with the another of the plurality of corner flow connectors. The first inlet flow passageway system further includes one portion of one of the plurality of liquid conduit splitters having the first inlet liquid coolant opening. The one portion of one of the plurality of liquid conduit splitters is in fluid communication with the one of the plurality of corner flow connectors via yet another of the plurality of adapters. The first outlet flow passageway system further includes another portion of the one of the plurality of liquid conduit splitters having the first inlet liquid coolant opening. The another portion of the one of the plurality of liquid conduit splitters is in fluid communication with the another of the plurality of corner flow connectors via further yet another of the plurality of adapters.

According to another aspect of the present disclosure, the chassis further includes a second side, next to the at least a first side. The second side includes a second inlet flow passageway system, a second outlet flow passageway system, and a second radiator. The second inlet flow passageway system includes the one of the plurality of transition flow connectors further having a second inlet transition opening and a second inlet flowthrough opening, one of the plurality of liquid conduits, and one of the plurality of corner flow connectors. The second outlet flow passageway system includes the another of the plurality of transition flow connectors further having a second outlet transition opening and a second outlet flowthrough opening, another of the plurality of liquid conduits, and another of the plurality of corner flow connectors. The second radiator includes a second radiator inlet portion and a second radiator outlet portion. The second inlet radiator portion has a second radiator inlet and the second radiator outlet portion has a second radiator outlet. Yet another of the plurality of adapters is mounted to the second inlet flowthrough opening, and the second radiator is at least mounted to the second inlet flow passageway system via the second radiator inlet and the yet another of the plurality of adapters. The second radiator is in fluid communication with the second inlet flow passageway system. The one of the plurality of transition flow connectors is in fluid communication with the one of the plurality of liquid conduits. The one of the plurality of liquid conduits is in fluid communication with the one of the plurality of corner flow connectors. Further yet another of the plurality of adapters is mounted to the second outlet flowthrough opening, and the second radiator is at least mounted to the second outlet flow passageway system via the second radiator outlet and the further yet another of the plurality of adapters. The second radiator is in fluid communication with the second outlet flow passageway system. The another of the plurality of transition flow connectors is in fluid communication with the another of the plurality of liquid conduits and the another of the plurality of liquid conduits is in fluid communication with the another of the plurality of corner flow connectors. The first inlet flow passageway system is in fluid communication with the second inlet flow passageway system via the second inlet transition opening and the second outlet flow passageway system is in fluid communication with the first outlet flow passageway system via the second outlet transition opening. The second inlet flow passageway system further includes one of the plurality of elongated structures. The one of the plurality of corner flow connectors is attached to the one of the plurality of elongated structures via yet another of the plurality of adapters, and the another of the plurality of corner flow connectors attached to the one of the plurality of elongated structures via further yet another of the plurality of adapters. The cooling fluid further flows from the first inlet flow passageway system, through the second inlet flow passageway system, through the second radiator, through the second outlet flow passageway system, and to the first outlet flow passageway system.

According to another aspect of the present disclosure, the chassis further includes a fifth transition side, next to the second side. The fifth transition side includes a distal transition passageway and a proximal transition passageway. The distal transition passageway includes one of the plurality of transition liquid conduits. The proximal transition passageway includes another of the plurality of transition liquid conduits. The chassis yet further includes a third side, next to the fifth transition side. The third side includes a third inlet flow passageway system, a third outlet flow passageway system, and a third radiator. The third inlet flow passageway system includes one of the plurality of corner flow connectors having a third inlet transition opening, one of the plurality of liquid conduits, and one of the plurality of transitional flow connectors having a third inlet flowthrough opening. The third outlet flow passageway system includes another of the plurality of transitional flow connectors having a third outlet flowthrough opening, another of the plurality of liquid conduits, and another of the plurality of corner flow connectors having a third outlet transition opening. The third radiator includes a third radiator inlet portion and a third radiator outlet portion. The third inlet radiator portion has a third radiator inlet and the third radiator outlet portion has a third radiator outlet. Yet another of the plurality of adapters is mounted to the third inlet flowthrough opening, and the third radiator is at least mounted to the third inlet flow passageway system via the third radiator inlet and the yet another of the plurality of adapters. The third radiator is in fluid communication with the third inlet flow passageway system. The one of the plurality of transition liquid conduits is in fluid communication with the one of the plurality of corner flow connectors. The one of the plurality of corner flow connectors is in fluid communication with the one of the plurality of liquid conduits, and the one of the plurality of liquid conduits is in fluid communication with the one of the plurality of transition flow connectors. Further yet another of the plurality of adapters is mounted to the third outlet flowthrough opening, and the third radiator is at least mounted to the third outlet flow passageway system via the third radiator outlet and the further yet another of the plurality of adapters. The third radiator is in fluid communication with the third outlet flow passageway system. The another of the plurality of transitional flow connectors is in fluid communication with the another of the plurality of liquid conduits, the another of the plurality of liquid conduits is in fluid communication with the another of the plurality of corner flow connectors, and the another of the plurality of corner flow connectors is in fluid communication with the another of the plurality of transition liquid conduits. The one of the plurality of transition liquid conduits is in fluid communication with the third inlet flow passageway system via the third inlet transition opening, and the third outlet flow passageway system is in fluid communication with the another of the plurality of transition liquid conduits via the third outlet transition opening. The cooling fluid further flows from the second inlet flow passageway system, through the distal transition passageway, through the third inlet flow passageway system, through the third radiator, through the third outlet flow passageway system, through the proximal transition passageway, and the second outlet flow passageway system.

According to further another aspect of the present disclosure, the third inlet flow passageway system further includes one portion of one of the plurality of liquid conduit splitters having a third inlet opening. The one portion of one of the plurality of liquid conduit splitters is in fluid communication with the one of the plurality of corner flow connectors via yet another of the plurality of adapters. The third outlet flow passageway system further includes another portion of the one of the plurality of liquid conduit splitters having a third outlet opening. The another portion of one of the plurality of liquid conduit splitters is in fluid communication with the another of the plurality of corner flow connectors via further yet another of the plurality of adapters. The liquid cooling heat exchange casing further includes a second liquid plate heat exchanger and a second heat source. The cooling fluid is further circulated via the third outlet opening and the third inlet opening, and the second liquid plate heat exchanger is configured to transfer heat from the second heat source.

According to another aspect of the present disclosure, the chassis further includes a fourth side, next to the third side. The fourth side includes a fourth inlet flow passageway system, a fourth outlet flow passageway system, and a fourth radiator. The fourth inlet flow passageway system includes one of the plurality of corner flow connectors having a fourth inlet transition opening, one of the plurality of liquid conduits, and the one of the plurality of transitional flow connectors having a fourth inlet flowthrough opening. The fourth outlet flow passageway system includes the another of the plurality of transitional flow connectors having a fourth outlet flowthrough opening. another of the plurality of liquid conduits, and another of the plurality of corner flow connectors having a fourth outlet transition opening. The fourth radiator includes a fourth radiator inlet portion and a fourth radiator outlet portion. The fourth inlet radiator portion has a fourth radiator inlet and the fourth radiator outlet portion has a fourth radiator outlet. The chassis yet further includes a sixth transition side, next to the fourth side and the at least a first side. The sixth transition side includes a distal transition passageway, and a proximal transition passageway. The distal transition passageway includes one of the plurality of transition liquid conduits. The proximal transition passageway includes another of the plurality of transition liquid conduits. Yet another of the plurality of adapters is mounted to the fourth inlet flowthrough opening, and the fourth radiator is at least mounted to the fourth inlet flow passageway system via the fourth radiator inlet and the yet another of the plurality of adapters. The fourth radiator is in fluid communication with the fourth inlet flow passageway system. The one of the plurality of transition liquid conduits is in fluid communication with the one of the plurality of corner flow connectors, the one of the plurality of corner flow connectors is in fluid communication with the one of the plurality of liquid conduits, and the one of the plurality of liquid conduits is in fluid communication with the one of the plurality of transition flow connectors. Further yet another of the plurality of adapters is mounted to the fourth outlet flowthrough opening, and the fourth radiator is at least mounted to the fourth outlet flow passageway system via the fourth radiator outlet and the further yet another of the plurality of adapters. The fourth radiator is in fluid communication with the fourth outlet flow passageway system. The another of the plurality of transitional flow connectors is in fluid communication with the another of the plurality of liquid conduits. The another of the plurality of liquid conduits is in fluid communication with the another of the plurality of corner flow connectors. The another of the plurality of corner flow connectors is in fluid communication with the another of the plurality of transition liquid conduits. The one of the plurality of transition liquid conduits is in fluid communication with the fourth inlet flow passageway system via the fourth inlet transition opening, and the fourth outlet flow passageway system is in fluid communication with the another of the plurality of transition liquid conduits via the fourth outlet transition opening. The fourth inlet flow passageway system further includes one of the plurality of elongated structures. The one of the plurality of corner flow connectors is attached to the one of the plurality of elongated structures via yet another of the plurality of adapters. The another of the plurality of corner flow connectors is attached to the one of the plurality of elongated structures via further yet another of the plurality of adapters. The cooling fluid further flows from the first inlet flow passageway system, through the distal transition passageway, through the fourth inlet flow passageway system, through the fourth radiator, through the fourth outlet flow passageway system, through the proximal transition passageway, and to the first outlet flow passageway system.

According to yet another aspect of the present disclosure, the liquid cooling heat exchange casing further includes at least one fan. The at least one fan configured to dissipate heat from the at least one radiator, the at least one fan is mounted to the at least one radiator.

According to further yet another aspect of the present disclosure, the amount of the at least one fan is four.

BRIEF DESCRIPTION OF THE DRAWINGS

The following figures are included to illustrate certain aspects of the embodiments and should not be viewed as exclusive embodiments. The subject matter disclosed is capable of considerable modifications, alterations, combinations, and equivalents in form and function, as will occur to those of ordinary skill in the relevant art and having the benefit of this disclosure.

DETAILED DESCRIPTION

Figure 1:
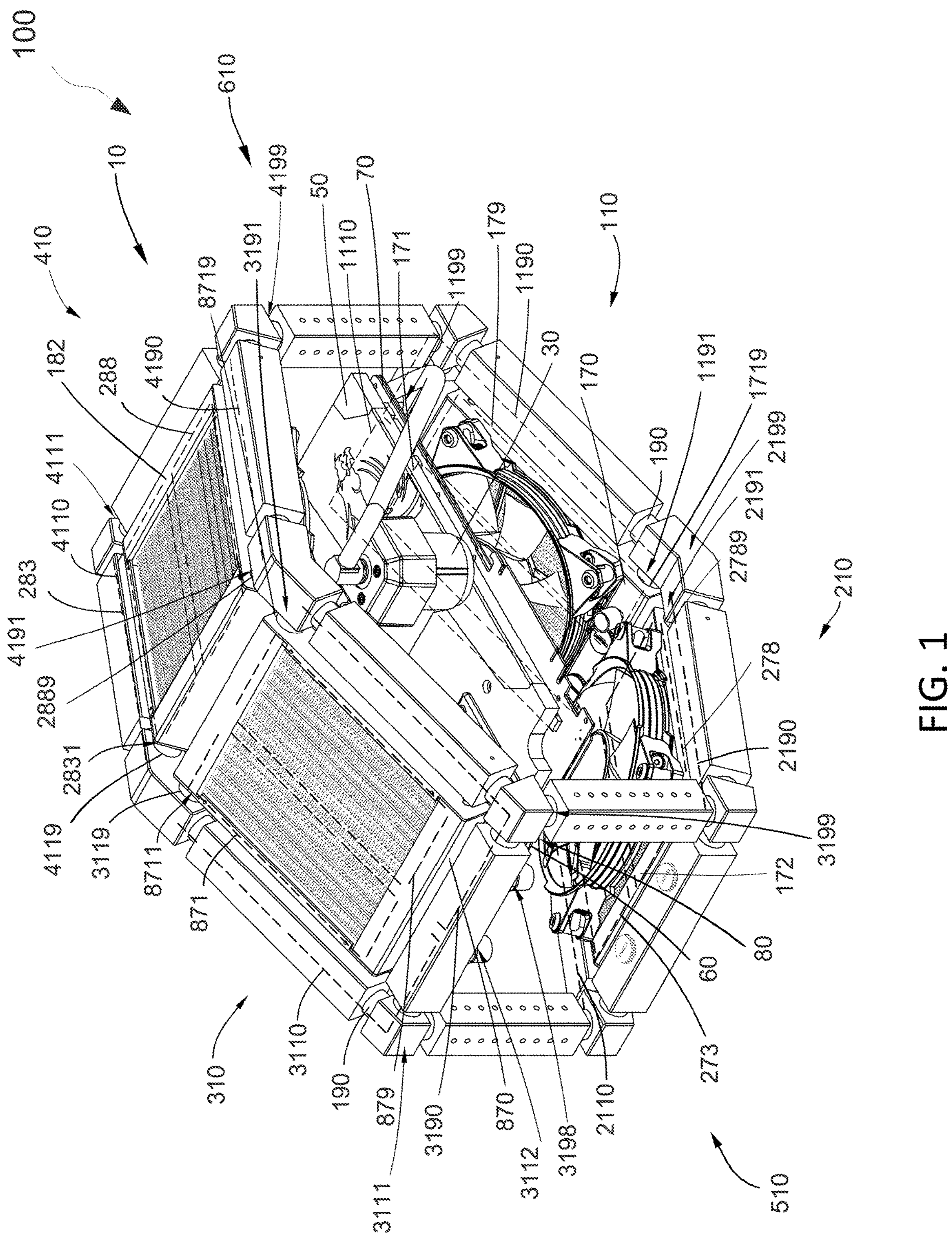
FIG. 1 illustrates a perspective view of a liquid cooling heat exchange casing 100, according to disclosed embodiments.

The following describes various principles related to mounting and disengagement of substrates, electronic components, and heat exchange apparatuses to the substrates or electronic components by way of reference to specific examples of liquid cooling heat exchange casings, including specific arrangements and examples of chassis' embodying innovative concepts. More particularly, but not exclusively, such innovative principles are described in relation to selected examples of liquid conduits, conduit splitters, connectors, and adapters and well-known functions or constructions are not described in detail for purposes of succinctness and clarity. Nonetheless, one or more of the disclosed principles can be incorporated in various other embodiments of liquid conduits, conduit splitters, connectors, and adapters to achieve any of a variety of desired outcomes, characteristics, and/or performance criteria.

Thus, liquid cooling heat exchange casings having attributes that are different from those specific examples discussed herein can embody one or more of the innovative principles and can be used in applications not described herein in detail. Accordingly, embodiments not described herein in detail also fall within the scope of this disclosure, as will be appreciated by those of ordinary skill in the relevant art following a review of this disclosure.

In the illustrated embodiments, the substrates and electronic components mounted to and disengaged from the chassis of the liquid cooling heat exchange casing, whereby heat exchange apparatuses are mounted to and disengaged therefrom, as an example, may be a substrate or electronic component of an electronic component system such as a host, a server, a network switch, or a computer. Additionally, the heat exchange apparatus, as an example, may include a waterblock set (or heat exchanger) having a base plate and a heat exchange chamber, a pump, the chassis, tubing, at least a radiator, a fan, and heat exchange apparatus power cables. The base plate is in thermal contact with a heat generating source (or heat source) such as a CPU or GPU, as an example, and the pump circulates fluid inside the heat exchange chamber, exchanging thermal energy between the base plate and the fluid, reducing the temperature of the base plate and increasing the temperature of the fluid. The pump may be connected to the radiator via the chassis, exchanging thermal energy between the radiator and ambient air, dissipating heat and reducing the temperature of the fluid before repeating the same process again. The shapes and sizes of the chassis and substrates and electronic components may be different. For clarity of illustration, a complete electronic component system is not shown, and the liquid cooling heat exchange casing is simplified, and in practice, both may be varied.

Example embodiments as disclosed herein, are directed to liquid cooling heat exchange casings including a chassis having at least a first side. The at least a first side includes a first inlet flow passageway system having a first inlet liquid coolant opening, a first outlet flow passageway system having a first outlet liquid coolant opening, a plurality of adapters, and at least one radiator. The at least one radiator is mounted to the first inlet flow passageway system via a radiator inlet and one of the plurality of adapters. The at least one radiator is mounted to the first outlet flow passageway system via a radiator outlet and another of the plurality of adapters. A cooling fluid flows from the first inlet liquid coolant opening, through the first inlet flow passageway system, through the at least one radiator, through the first outlet flow passageway system, and to the first outlet liquid coolant opening, before being circulated to repeat the flow process again.

Figure 2:
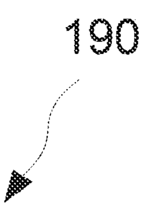
FIG. 2 illustrates a perspective view of an adapter 14, according to disclosed embodiments.
Figure 2:
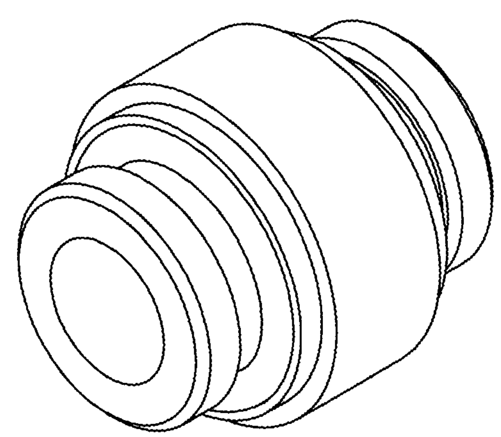
Figure 7A:
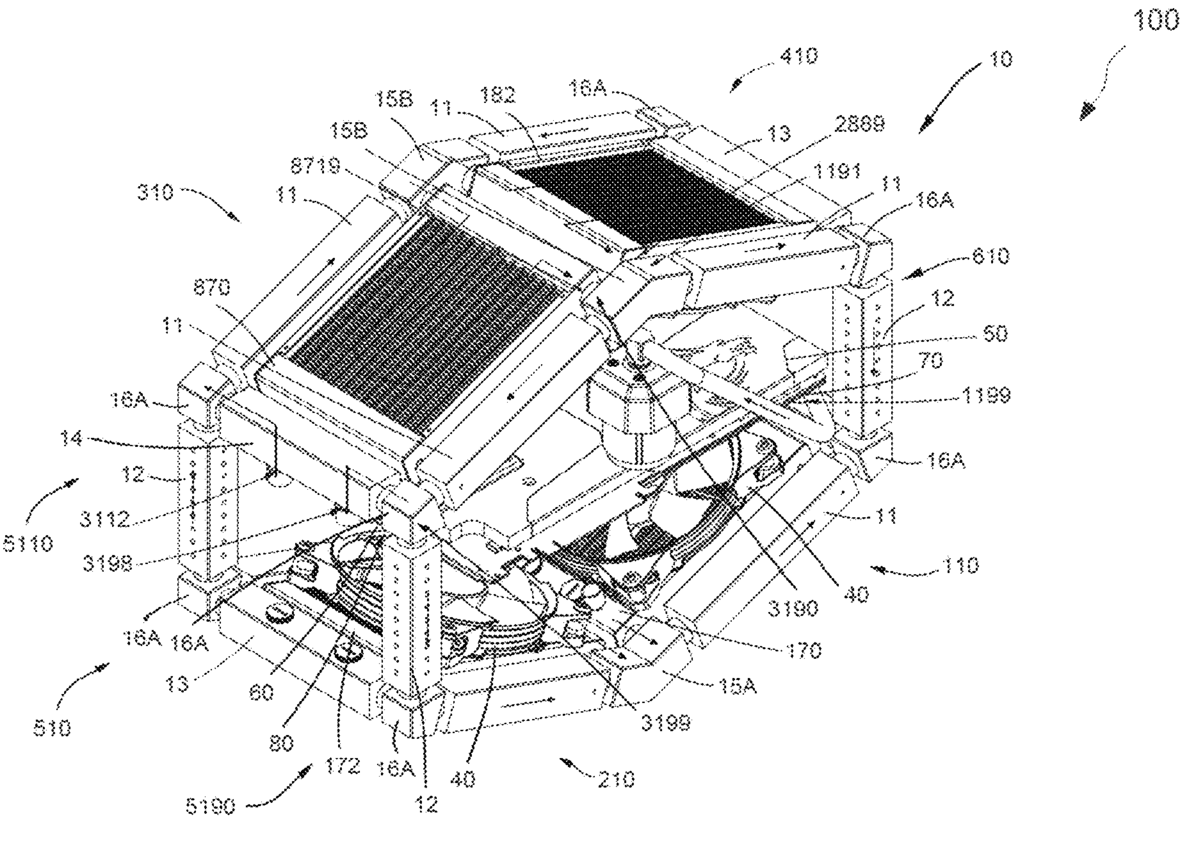
FIG. 7A is a perspective view of the liquid cooling heat exchange casings of FIG. 1, illustrating fluid flow in the liquid cooling heat exchange casing during operation thereof, according to embodiments of the disclosure.
Figure 7B:
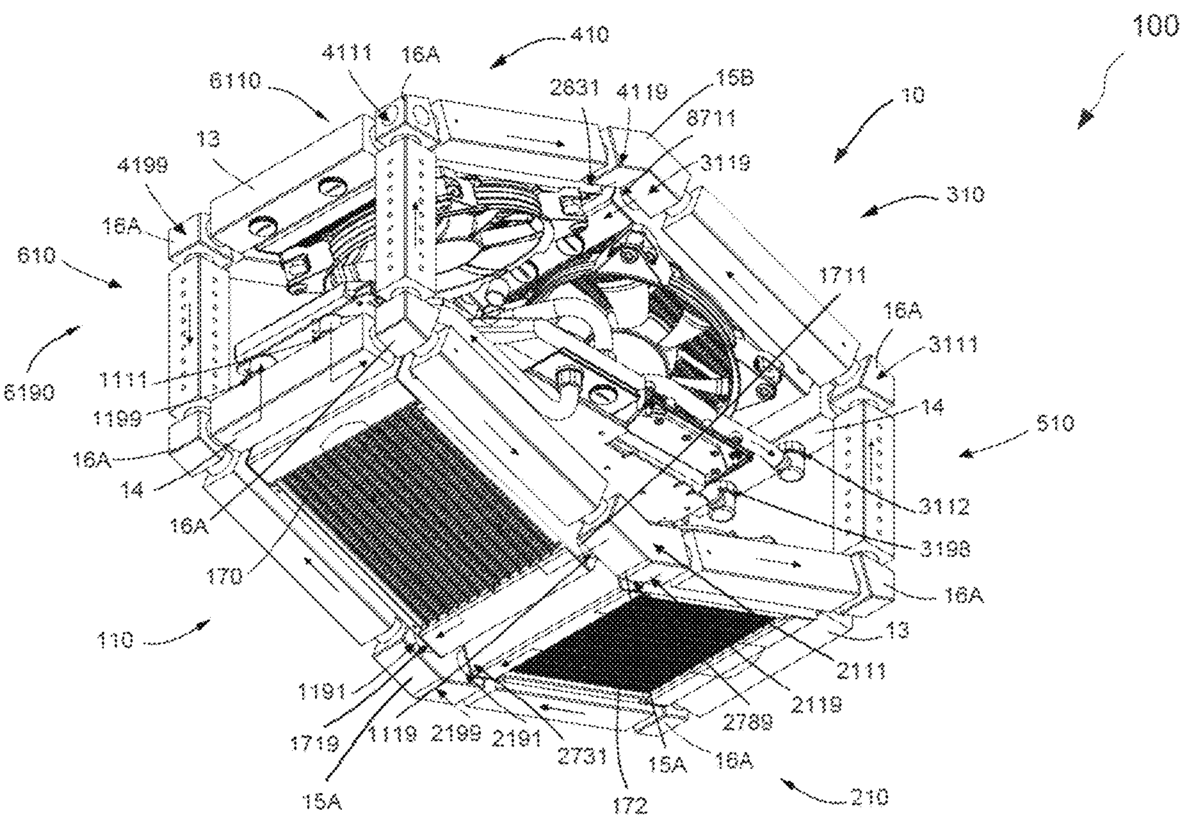
FIG. 7B is another perspective view of the liquid cooling heat exchange casings of FIG. 1, illustrating fluid flow in the liquid cooling heat exchange casing during operation thereof, according to embodiments of the disclosure.

FIG. 1 illustrates a perspective view of a liquid cooling heat exchange casing 100, according to disclosed embodiments. FIG. 2 illustrates a perspective view of an adapter 190, according to disclosed embodiments. As illustrated in FIGS. 1 and 2, a liquid cooling heat exchange casing 100, including a chassis 10 having at least a first side 110 is provided. The at least a first side 110 includes a first inlet flow passageway system 1110, a first outlet flow passageway system 1190, a plurality of adapters 190, and at least one radiator 170. The first inlet flow passageway system 1110 has a first inlet liquid coolant opening 1111 (as illustrated in FIG. 7B) and a first inlet flowthrough opening 1119 (as illustrated in FIG. 7B) and the first outlet flow passageway system 1190 has a first outlet liquid coolant opening 1199 and a first outlet flowthrough opening 1191. The at least one radiator 170 includes a radiator inlet portion 171 and a radiator outlet portion 179. The radiator inlet portion 171 has a radiator inlet 1711 (as illustrated in FIG. 7B) and the radiator outlet portion 179 has a radiator outlet 1719. One of the plurality of adapters 190 is mounted to the first inlet flowthrough opening 1119 (as illustrated in FIG. 7B). The at least one radiator 170 is at least mounted to the first inlet flow passageway system 1110 via the radiator inlet 1711 (as illustrated in FIG. 7B) and the one of the plurality of adapters 190 (as illustrated in FIG. 7B). The at least one radiator 170 is in fluid communication with the first inlet flow passageway system 1110. Another of the plurality of adapters 190 is mounted to the first outlet flowthrough opening 1191. The at least one radiator 170 is at least mounted to the first outlet flow passageway system 1190 via the radiator outlet 1719 and the another of the plurality of adapters 190. The at least one radiator 170 is in fluid communication with the first outlet flow passageway system 1190. The cooling fluid flows from the first inlet liquid coolant opening 1111 (as illustrated in FIG. 7B), through the first inlet flow passageway system 1110, through the at least one radiator 170, through the first outlet flow passageway system 1190, and to the first outlet liquid coolant opening 1199, before being circulated to repeat the flow process again.

In the illustrated embodiments, the liquid cooling heat exchange casing 100 may further include a pump 30. The pump 30 is configured to circulate liquid coolant via the first outlet liquid coolant opening 1199 and the first inlet liquid coolant opening 1111 (as illustrated in FIG. 7B).

In the illustrated embodiments, the liquid cooling heat exchange casing 100 may further include at least a liquid plate heat exchanger 50 and at least a heat source 70. The at least a liquid plate heat exchanger 50 is in fluid communication with the pump 30 and the at least a liquid plate heat exchanger 50 is configured to transfer heat from the heat source 70.

As further illustrated, the chassis 10 further includes a second side 210, next to the at least a first side 110. The second side 210 includes a second inlet flow passageway system 2110, a second outlet flow passageway system 2190, and a second radiator 172. The second inlet flow passageway system 2110 has a second inlet transition opening 2111 (as illustrated in FIG. 7B) and a second inlet flowthrough opening 2119 (as illustrated in FIG. 7B). The second outlet flow passageway system 2190 has a second outlet transition opening 2199 and a second outlet flowthrough opening 2191. The second radiator 172 includes a second radiator inlet portion 273 and a second radiator outlet portion 278. The second radiator inlet portion 273 has a second radiator inlet 2731 (as illustrated in FIG. 7B) and the second radiator outlet portion 278 has a second radiator outlet 2789. Yet another of the plurality of adapters 190 is mounted to the second inlet flowthrough opening 2119, and the second radiator 172 is at least mounted to the second inlet flow passageway system 2110 via the second radiator inlet 2731 (as illustrated in FIG. 7B) and the yet another of the plurality of adapters 190 (as illustrated in FIG. 7B). The second radiator 172 is in fluid communication with the second inlet flow passageway system 2110. Further yet another of the plurality of adapters 190 is mounted to the second outlet flowthrough opening 2191, and the second radiator 172 is at least mounted to the second outlet flow passageway system 2190 via the second radiator outlet 2789 and the further yet another of the plurality of adapters 190. The second radiator 172 is in fluid communication with the second outlet flow passageway system 2190. The first inlet flow passageway system 1110 is in fluid communication with the second inlet flow passageway system 2110 via the second inlet transition opening 2111 (as illustrated in FIG. 7B) and the second outlet flow passageway system 2190 is in fluid communication with the first outlet flow passageway system 1190 via the second outlet transition opening 2199, whereby the cooling fluid further flows from the first inlet flow passageway system 1110, through the second inlet flow passageway system 2110, through the second radiator 172, through the second outlet flow passageway system 2190, and to the first outlet flow passageways system 1190.

As further illustrated, the chassis 10 further includes a third side 310. The third side 310 includes a third inlet flow passageway system 3110, a third outlet flow passageway system 3190, and a third radiator 870. The third inlet flow passageway system 3110 has a third inlet transition opening 3111 and a third inlet flowthrough opening 3119. The third outlet flow passageway system 3190 has a third outlet transition opening 3199 and a third outlet flowthrough opening 3191. The third radiator 870 includes a third radiator inlet portion 871 and a third radiator outlet portion 879. The third radiator inlet portion 871 has a third radiator inlet 8711 and the third radiator outlet portion 879 has a third radiator outlet 8719. Yet another of the plurality of adapters 190 is mounted to the third inlet flowthrough opening 3119, and the third radiator 870 is at least mounted to the third inlet flow passageway system 3110 via the third radiator inlet 8711 and the yet another of the plurality of adapters 190. The third radiator 870 is in fluid communication with the third inlet flow passageway system 3110. Further yet another of the plurality of adapters 190 is mounted to the third outlet flowthrough opening 3191, and the third radiator 870 is at least mounted to the third outlet flow passageway system 3190 via the third radiator outlet 8719 and the further yet another of the plurality of adapters 190. The third radiator 870 is in fluid communication with the third outlet flow passageway system 3190. The second inlet flow passageway system 2110 is in fluid communication with the third inlet flow passageway system 3110 via the third inlet transition opening 3111. The third outlet flow passageway system 3190 is in fluid communication with the second outlet flow passageway system 2190 via the third outlet transition opening 3199. The cooling fluid further flows from the second inlet flow passageway system 2110, through the third inlet flow passageway system 3110, through the third radiator 870, through the third outlet flow passageway system 3190, and to the second outlet flow passageway system 2190.

In the illustrated embodiments, the third inlet flow passageway system 3110 may further include a third inlet opening 3112 and the third outlet flow passageway system 3190 may further include a third outlet opening 3198. In the illustrated embodiments, the liquid cooling heat exchange casing 100 may further include a second liquid plate heat exchanger 60 and a second heat source 80. The cooling fluid is further circulated via the third outlet opening 3198 and the third inlet opening 3112, and the second liquid plate heat exchanger 60 is configured to transfer heat from the second heat source 80.

As further illustrated, the chassis 10 further includes a fourth side 410, next to the third side 310. The fourth side 410 includes a fourth inlet flow passageway system 4110, a fourth outlet flow passageway system 4190, and a fourth radiator 182. The fourth inlet flow passageway system 4110 has a fourth inlet opening 4111 and a fourth inlet flowthrough opening 4119. The fourth outlet flow passageway system 4190 has a fourth outlet opening 4199 and a fourth outlet flowthrough opening 4191. The fourth radiator 182 includes a fourth radiator inlet portion 283 and a fourth outlet portion 288. The fourth inlet portion 283 has a fourth radiator inlet 2831 and the fourth outlet portion 288 has a fourth radiator outlet 2889. Yet another of the plurality of adapters 190 is mounted to the fourth inlet flowthrough opening 4119, and the fourth radiator 182 is at least mounted to the fourth inlet flow passageway system 4110 via the fourth radiator inlet 2831 and the yet another of the plurality of adapters 190. The fourth radiator 182 is in fluid communication with the fourth inlet flow passageway system 4110. Further yet another of the plurality of adapters 190 is mounted to the fourth outlet flowthrough opening 4191, and the fourth radiator 182 is at least mounted to the fourth outlet flow passageway system 4190 via the fourth radiator outlet 2889 and the further yet another of the plurality of adapters 190. The fourth radiator 182 is in fluid communication with the fourth outlet flow passageway system 4190. The first inlet flow passageway system 1110 is in fluid communication with the fourth inlet flow passageway system 4110 and the fourth outlet flow passageway system 4190 is in fluid communication with the first outlet flow passageway system 1190, whereby the cooling fluid further flows from the first inlet flow passageway system 1110, through the fourth inlet flow passageway system 4110, through the fourth radiator 182, through the fourth outlet flow passageway system 4190, and to the first outlet passageway system 1190.

Figure 3:
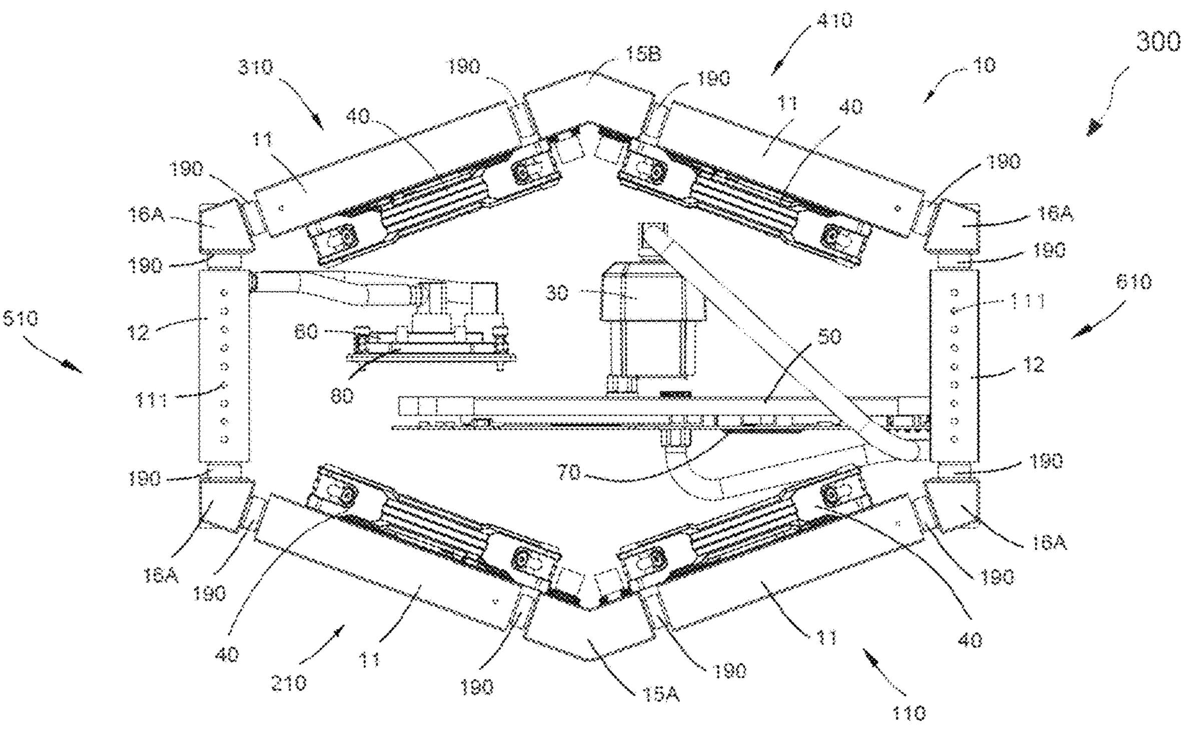
FIG. 3 illustrates a perspective view of another liquid cooling heat exchange casing, according to disclosed embodiments.

FIG. 3 illustrates a perspective view of another liquid cooling heat exchange casing 300, according to disclosed embodiments. Referring to the illustrations of FIGS. 1 and 2, the chassis 10 of the another liquid cooling heat exchange casing 300 is provided. Thus, the chassis 10 may be understood with reference to the above as like numerals designate like components which may not be described again in detail for brevity. As illustrated in FIG. 3, and referring to the illustrations of FIGS. 1 and 2, the chassis 10 of the liquid cooling heat exchange casing 300 further includes a plurality of transition liquid conduits 12 and a mounting system. The first inlet flow passageway system 1110 is in fluid communication with the fourth inlet flow passageway system 4110 via the plurality of transition liquid conduits 12 and the fourth outlet flow passageway system 4190 is in fluid communication with the first outlet flow passageway system 1190 via the plurality of transition liquid conduits 12. The mounting system includes at least a mounting plate (not shown), an expansion card slot (not shown), and a plurality of fastener holes 111. The plurality of fastener holes 111 is disposed on at least one side of each of the plurality of transition liquid conduits 12. The at least a mounting plate is mounted to the plurality of fastener holes 111 disposed on at least two of the plurality of transition liquid conduits 12, and the expansion card slot is disposed on at least two of the plurality of transition liquid conduits 12. The mounting system is configured to mount at least one of a motherboard, an expansion card, a pump, a reservoir, a liquid plate heat exchanger, a heat source, an electronic component or any combination of the foregoing, thereto.

Figure 4B:
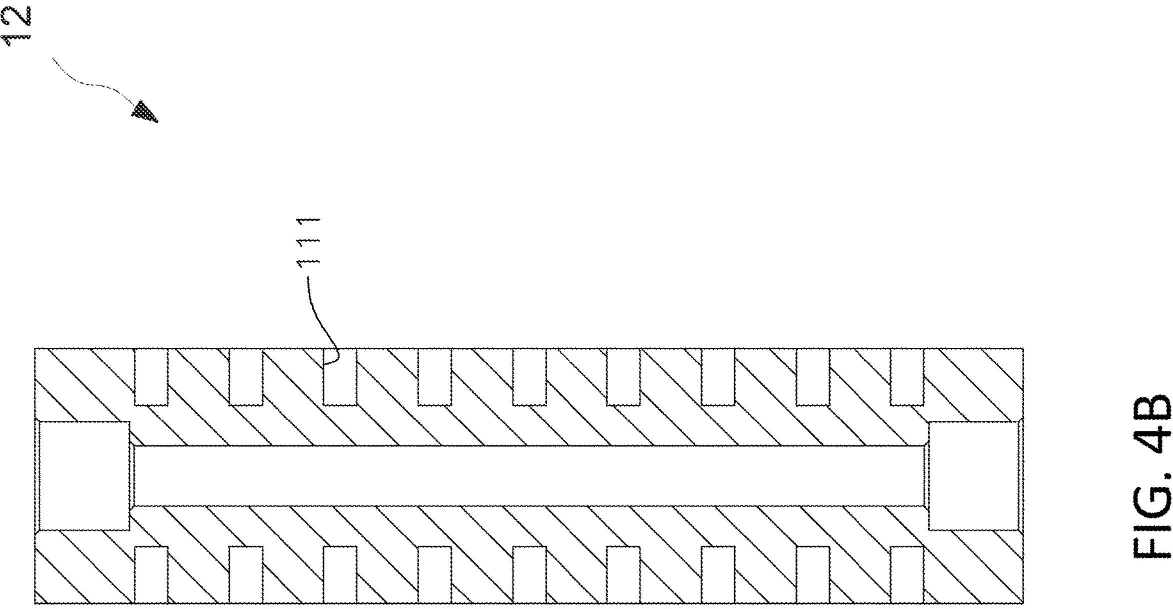
FIG. 4B is a cross-section view of the transition liquid conduit of FIG. 4A, according to disclosed embodiments.
Figure 4A:
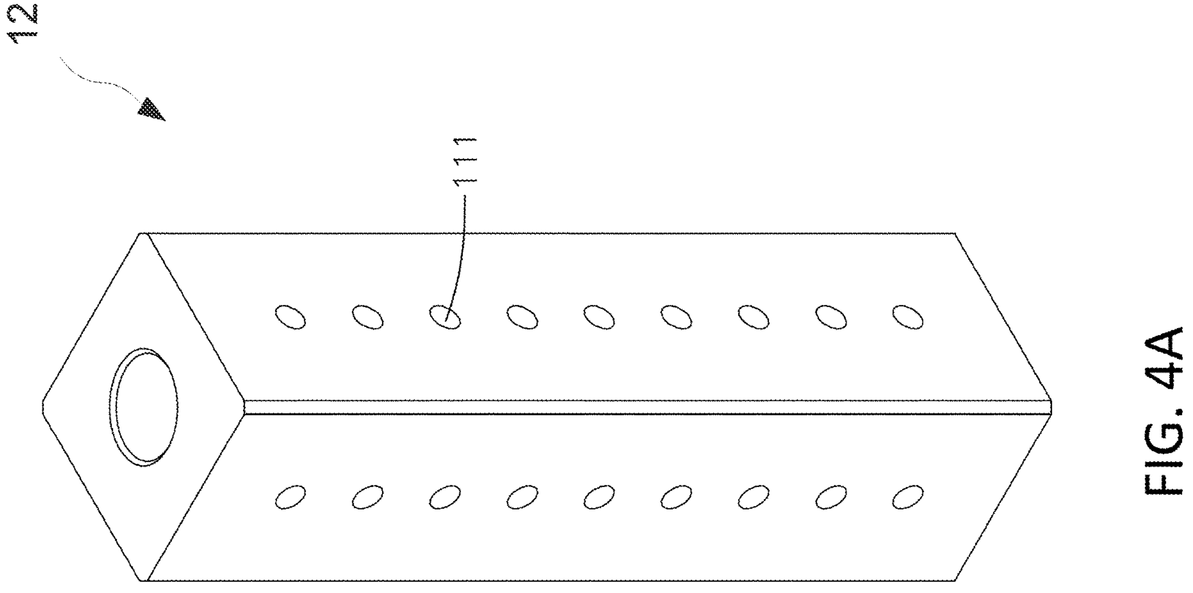
FIG. 4A illustrates a perspective view of a transition liquid conduit, according to disclosed embodiments.
Figure 5A:
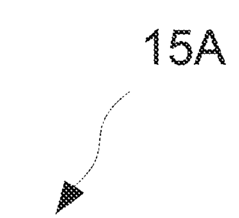
FIG. 5A illustrates a perspective view of a transition flow connector, according to disclosed embodiments.
Figure 5A:
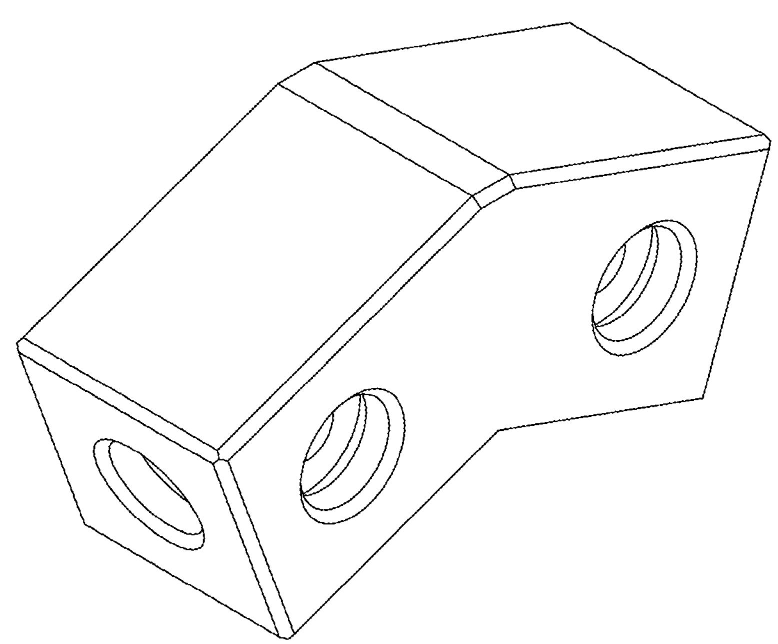
Figure 5B:
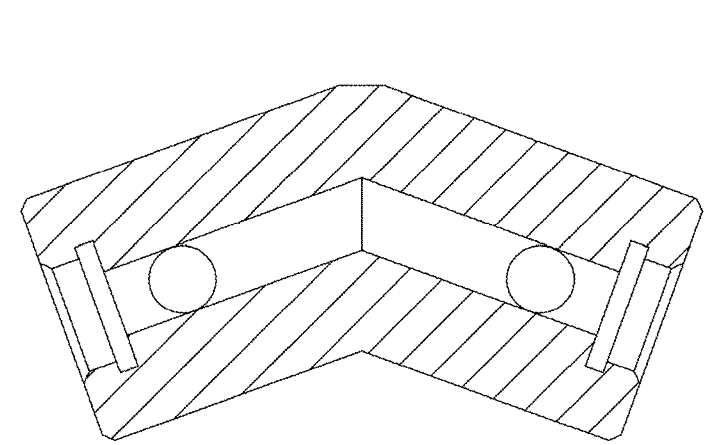
FIG. 5B is a cross-section view of the transition flow connector of FIG. 5A, according to disclosed embodiments.
Figure 6A:
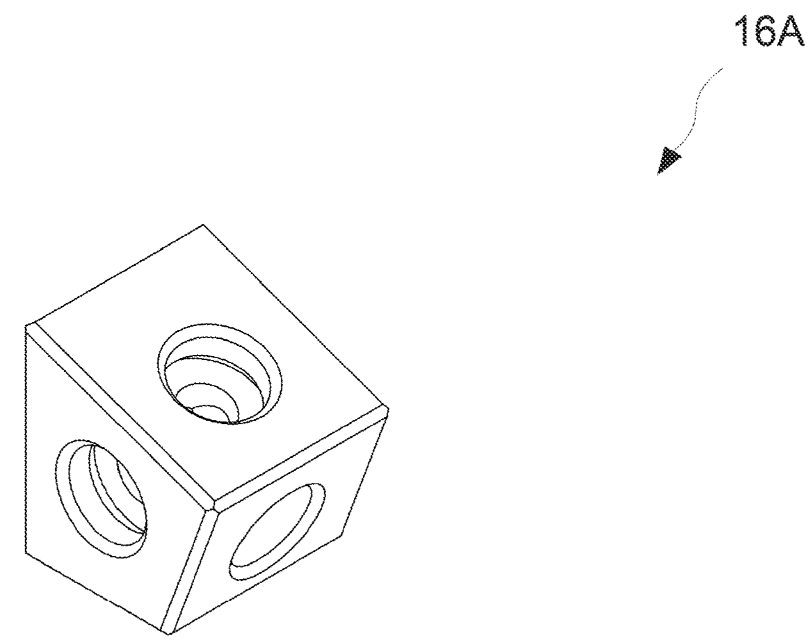
FIG. 6A illustrates a perspective view of a corner flow connector, according to disclosed embodiments.
Figure 6B:
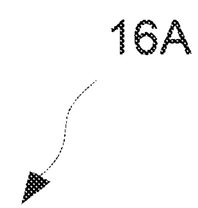
FIG. 6B is a cross-section view of the plurality of corner flow connectors of FIG. 6A, according to disclosed embodiments.
Figure 6B:
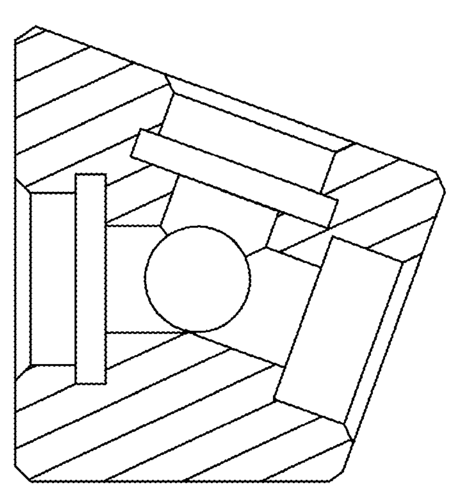

FIG. 4A illustrates a perspective view of a transition liquid conduit, according to disclosed embodiments. FIG. 4B is a cross-section view of the transition liquid conduit of FIG. 4A, according to disclosed embodiments. FIG. 5A illustrates a perspective view of a transition flow connector, according to disclosed embodiments. FIG. 5B is a cross-section view of the transition flow connector of FIG. 5A, according to disclosed embodiments. FIG. 6A illustrates a perspective view of a corner flow connector, according to disclosed embodiments. FIG. 6B is a cross-section view of the plurality of corner flow connectors 16A of FIG. 6A, according to disclosed embodiments. FIG. 7A is a perspective view of the liquid cooling heat exchange casings 100 of FIGS. 1 and 2, illustrating fluid flow in the liquid cooling heat exchange casing 100 during operation thereof, according to embodiments of the disclosure. FIG. 7B is another perspective view of the liquid cooling heat exchange casing 100 of FIG. 7A, illustrating fluid flow in the liquid cooling heat exchange casing 100 during operation thereof, according to embodiments of the disclosure. As illustrated in FIGS. 4A to 7B, and referring to the illustrations of FIGS. 1 to 3, in addition to the plurality of transition liquid conduits 12, the chassis 10 further includes a plurality of liquid conduits 11, a plurality of elongated structures 13, a plurality of liquid conduit splitters 14, a plurality of corner flow connectors 16A, and a plurality of transition flow connectors 15A/15B. As illustrated, a shape of the plurality of transition liquid conduits 12, the plurality of liquid conduits 11, the plurality of elongated structures 13, and the plurality of liquid conduit splitters is elongated cube shape and dimensions thereamong, respectively, are the same; however, the illustrated embodiments are not limited thereto. The shape of the plurality of transition liquid conduits 12, the plurality of liquid conduits 11, the plurality of elongated structures 13, and the plurality of liquid conduit splitters 14 may be cylinder shaped, polygonal prism shaped, triangular prism shaped, hexagonal prism shaped, or other shapes, respectively, and the dimensions may be different.

As illustrated, the plurality of fastener holes 111 is disposed on at least one side of each of the plurality of transition liquid conduits 12; however, the illustrated embodiments are not limited thereto. The plurality of fastener holes 111 may be disposed on at least one side of each of the plurality of liquid conduits 11, each of the plurality of elongated structures 13, and/or each of the plurality of liquid conduit splitters 14. In the illustrated embodiments, the plurality of fastener holes 111 may also be disposed on two, three or four sides of each of the plurality of transition liquid conduits 12, each of the plurality of liquid conduits 11, each of the plurality of elongated structures 13, and/or each of the plurality of liquid conduit splitters 14. As long as cooling fluid flows through a designed flow path and the at least a mounting plate (not shown) may be mounted to the plurality of fastener holes 111 disposed on at least two of the plurality of transition liquid conduits 12, disposed on at least two of the plurality of liquid conduits 11, disposed on at least two of the plurality of elongated structures 13 and/or disposed on at least two of the plurality of liquid conduit splitters 14, or any combination of the foregoing, and the expansion card slot (not shown) may be disposed on at least two of the plurality of transition liquid conduits 12, disposed on at two of the plurality of liquid conduits 11, disposed on at least two of the plurality of elongated structures 13 and/or disposed on at least two of the plurality of liquid conduit splitters 14, or any combination of the foregoing. Thus, the shape of the plurality of transition liquid conduits 12, the plurality of liquid conduits 11, the plurality of elongated structures 13, and the plurality of liquid conduit splitters 14 may be determined based upon a desired angle of the at least a mounting plate (not shown) and/or the expansion card slot (not shown), whereby flat or angled attachment planes may be configured.

In the illustrated embodiments, each of the plurality of transition liquid conduits 12 and each of the plurality of liquid conduits 11 is configured for fluid to flow therethrough via a closed conduit and a depth of the plurality of fastener holes 111 does not extend through the closed conduit.

In the illustrated embodiments, each of the plurality of elongated structures 13 may be configured for fluid to not flow therethrough, and be a solid structure; however, the embodiments are not limited thereto. In the illustrated embodiments, as the direction of flow of cooling fluid flowing through each of the plurality of elongated structures 13 may be controlled by each of the plurality of corner flow connectors 16A, each of the plurality of elongated structures 13 may be configured for fluid to flow therethrough (as an example, same as the plurality of transition liquid conduits 12 and the plurality of liquid conduits 11), but function as the plurality of elongated structures 13 by not having fluid flow therethrough via the plurality of corner flow connectors 16A.

In the illustrated embodiments, each of the plurality of liquid conduit splitters 14 is configured for fluid to flow in two separate flow directions via a dividing panel. In the illustrated embodiments, each of the plurality of corner flow connectors 16A is configured for fluid to flow in at least one flow direction. As illustrated, a shape of the plurality of corner flow connectors 16A is an unequal height cube shape and the one direction may be generally a right angle, acute angle, or obtuse angle direction. A more than one flow direction of the plurality of corner flow connectors 16A may generally be two right angle directions, two acute angle directions, or two obtuse angle directions, or any combination of the foregoing. In the illustrated embodiments, each of the plurality of transition flow connectors 15A/15B is configured for fluid to flow in at least one flow direction. In the illustrated embodiments, as an example, each of the plurality of transition flow connectors 15A is configured for fluid to flow in one flow direction. In the illustrated embodiments, as an example, each of the plurality of transition flow connectors 15B is configured for fluid to flow in two flow directions via a dividing panel. As illustrated, a shape of the transition flow connector is two angled integrated cube shaped and the one direction may be generally a right angle, acute angle, or obtuse angle direction. A more than one flow direction of the transition flow connector may generally be two acute angle directions, or two obtuse angle directions, or any combination of the foregoing.

Referring again to the illustration of FIG. 2, and referring again to the illustrations in FIGS. 1, 3, and 7A and 7B, in the illustrated embodiments, the adapter 190 liquid tight connects any combination and amount of the plurality of liquid conduit splitters 14, the plurality of corner flow connectors 16A, the plurality of liquid conduits 11, the plurality of transition liquid connectors 15A/15B, the plurality of elongated structures 13, and the plurality of transition liquid conduits 12 thereamong, forming unlimited choices of casing 10 shapes and/or sizes via threads and/or sealing rings.

Referring again to the illustrations of FIGS. 7A to 7B, the chassis 10 of the liquid cooling heat exchange casing 100 and another liquid cooling heat exchange casing 300 is provided. Thus, the chassis 10 may be understood with reference to the above as like numerals designate like components which may not be described again in detail for brevity.

In the illustrated embodiments, the first inlet flow passageway system 1110 further includes one of the plurality of corner flow connectors 16A, one of the plurality of liquid conduits 11, and one of the plurality of transition flow connectors 15A having the first inlet flowthrough opening 1119. The one of the plurality of corner flow connectors 16A in fluid communication with the one of the plurality of liquid conduits 11 via yet another of the plurality of adapters 190. The one of the plurality of liquid conduits 11 is in fluid communication with the one of the plurality of transition flow connectors 15A via yet another of the plurality of adapters 190. The first outlet flow passageway system 1190 further includes another of the plurality of transition flow connectors 15A having the first outlet flowthrough opening 1191, another of the plurality of liquid conduits 11, and another of the plurality of corner flow connectors 16A. The another of the plurality of corner flow connectors 16A is in fluid communication with the plurality of liquid conduits 11 via further yet another of the plurality of adapters 190. The another of the plurality of liquid conduits 11 is in fluid communication with the another of the plurality of corner flow connectors 16A via further yet another of the plurality of adapters 190. The first inlet flow passageway system 1110 further includes one portion of one of the plurality of liquid conduit splitters 14 having the first inlet liquid coolant opening 1111. The one portion of one of the plurality of liquid conduit splitters 14 is in fluid communication with the one of the plurality of corner flow connectors 16A via yet another of the plurality of adapters 190. The first outlet flow passageway system 1190 further includes another portion of the one of the plurality of liquid conduit splitters 14 having the first inlet liquid coolant opening 1111. The another portion of the one of the plurality of liquid conduit splitters 14 is in fluid communication with the another of the plurality of corner flow connectors 16A via further yet another of the plurality of adapters 190.

As further illustrated, the chassis 10 further includes a second side 210, next to the at least a first side 110. The second side 210 includes a second inlet flow passageway system 2110, a second outlet flow passageway system 2190, and a second radiator 172. The second inlet flow passageway system 2110 includes the one of the plurality of transition flow connectors 15A further having a second inlet transition opening 2111 and a second inlet flowthrough opening 2119, one of the plurality of liquid conduits 11, and one of the plurality of corner flow connectors 16A. The second outlet flow passageway system 2190 includes the another of the plurality of transition flow connectors 15A further having a second outlet transition opening 2199 and a second outlet flowthrough opening 2191, another of the plurality of liquid conduits 11, and another of the plurality of corner flow connectors 16A. The second radiator 172 includes a second radiator inlet portion 273 and a second radiator outlet portion 278. The second radiator inlet portion 273 has a second radiator inlet 2731 and the second radiator outlet portion 278 has a second radiator outlet 2789. Yet another of the plurality of adapters 190 is mounted to the second inlet flowthrough opening 2119, and the second radiator 172 is at least mounted to the second inlet flow passageway system 2110 via the second radiator inlet 2731 and the yet another of the plurality of adapters 190. Yet another of the plurality of adapters 190 is mounted to the one of the plurality of transition flow connectors 15A and the one of the plurality of liquid conduits 11, and yet another of the plurality of adapters 190 is mounted to the one of the plurality of liquid conduits 11 and the one of the plurality of corner flow connectors 16A. The second radiator 172 is in fluid communication with the second inlet flow passageway system 2110. The one of the plurality of transition flow connectors 15A is in fluid communication with the one of the plurality of liquid conduits 11. The one of the plurality of liquid conduits 11 is in fluid communication with the one of the plurality of corner flow connectors 16A. Further yet another of the plurality of adapters 190 is mounted to the second outlet flowthrough opening 2191, and the second radiator 172 is at least mounted to the second outlet flow passageway system 2190 via the second radiator outlet 2789 and the further yet another of the plurality of adapters 190. Further yet another of the plurality of adapters 190 is mounted to the another of the plurality of transition flow connectors 15A and the another of the plurality of liquid conduits 11, and further yet another of the plurality of adapters 190 is mounted to the another of the plurality of liquid conduits 11 and the another of the plurality of corner flow connectors 16A. The second radiator 172 is in fluid communication with the second outlet flow passageway system 2190. The another of the plurality of transition flow connectors 15A is in fluid communication with the another of the plurality of liquid conduits 11 and the another of the plurality of liquid conduits 11 is in fluid communication with the another of the plurality of corner flow connectors 16A. The first inlet flow passageway system 1110 is in fluid communication with the second inlet flow passageway system 2110 via the second inlet transition opening 2111 and the second outlet flow passageway system 2190 is in fluid communication with the first outlet flow passageway system 1190 via the second outlet transition opening 2199. The second inlet flow passageway system 2110 further includes one of the plurality of elongated structures 13. The one of the plurality of corner flow connectors 16A is attached to the one of the plurality of elongated structures 13 via yet another of the plurality of adapters 190, and the another of the plurality of corner flow connectors 16A attached to the one of the plurality of elongated structures 13 via further yet another of the plurality of adapters 190. The cooling fluid further flows from the first inlet flow passageway system 1110, through the second inlet flow passageway system 2110, through the second radiator 172, through the second outlet flow passageway system 2190, and to the first outlet flow passageway system 1190.

As further illustrated, the chassis 10 further includes a fifth transition side 510, next to the second side 210. The fifth transition side 510 includes a fifth distal transition passageway 5110 and a fifth proximal transition passageway 5190. The fifth distal transition passageway 5110 includes one of the plurality of transition liquid conduits 12. The fifth proximal transition passageway 5190 includes another of the plurality of transition liquid conduits 12.

As further illustrated, the chassis 10 yet further includes a third side 310, next to the fifth transition side 510. The third side 310 includes a third inlet flow passageway system 3110, a third outlet flow passageway system 3190, and a third radiator 870. The third inlet flow passageway system 3110 includes one of the plurality of corner flow connectors 16A having a third inlet transition opening 3111, one of the plurality of liquid conduits 11, and one of the plurality of transitional flow connectors 15B having a third inlet flowthrough opening 3119. The third outlet flow passageway system 3190 includes another of the plurality of transitional flow connectors 15B having a third outlet flowthrough opening 3191, another of the plurality of liquid conduits 11, and another of the plurality of corner flow connectors 16A having a third outlet transition opening 3199. The third radiator 870 includes a third radiator inlet portion 871 and a third radiator outlet portion 879. The third inlet portion 871 has a third radiator inlet 8711 and the third radiator outlet portion 879 has a third radiator outlet 8719. Yet another of the plurality of adapters 190 is mounted to the third inlet flowthrough opening 3119, and the third radiator 870 is at least mounted to the third inlet flow passageway system 3110 via the third radiator 870 inlet and the yet another of the plurality of adapters 190. Yet another of the plurality of adapters 190 is mounted to the one of the plurality of transition liquid conduits 12 and the third inlet transition opening 3111, yet another of the plurality of adapters 190 is mounted to the one of the plurality of corner flow connectors 16A and the one of the plurality of liquid conduits 11, and yet another of the plurality of adapters 190 is mounted to the one of the plurality of liquid conduits 11 and the one of the plurality of transition flow connectors 15B. The third radiator 870 is in fluid communication with the third inlet flow passageway system 3110. The one of the plurality of transition liquid conduits 12 is in fluid communication with the one of the plurality of corner flow connectors 16A. The one of the plurality of corner flow connectors 16A is in fluid communication with the one of the plurality of liquid conduits 11, and the one of the plurality of liquid conduits 11 is in fluid communication with the one of the plurality of transition flow connectors 15B. Further yet another of the plurality of adapters 190 is mounted to the third outlet flowthrough opening 3191, and the third radiator 870 is at least mounted to the third outlet flow passageway system 3190 via the third radiator outlet 8719 and the further yet another of the plurality of adapters 190. Further yet another of the plurality of adapters 190 is mounted to the another of the plurality of transitional flow connectors 15B and the another of the plurality of liquid conduits 11, further yet another of the plurality of adapters 190 is mounted to the another of the plurality of liquid conduits 11 and the another of the plurality of corner flow connectors 16A and further yet another of the plurality of adapters 190 is mounted to the another of the plurality of corner flow connectors 16A and the another of the plurality of transition liquid conduits 12. The third radiator 870 is in fluid communication with the third outlet flow passageway system 3190. The another of the plurality of transitional flow connectors 15B is in fluid communication with the another of the plurality of liquid conduits 11, the another of the plurality of liquid conduits 11 is in fluid communication with the another of the plurality of corner flow connectors 16A, and the another of the plurality of corner flow connectors 16A is in fluid communication with the another of the plurality of transition liquid conduits 12. The one of the plurality of transition liquid conduits 12 is in fluid communication with the third inlet flow passageway system 3110 via the third inlet transition opening 3111, and the third outlet flow passageway system 3190 is in fluid communication with the another of the plurality of transition liquid conduits 12 via the third outlet transition opening 3199. The cooling fluid further flows from the second inlet flow passageway system 2110, through the fifth distal transition passageway 5110, through the third inlet flow passageway system 3110, through the third radiator 870, through the third outlet flow passageway system 3190, through the fifth proximal transition passageway 5190, and the second outlet flow passageway system 2190.

In the illustrated embodiments, the third inlet flow passageway system 3110 further includes one portion of one of the plurality of liquid conduit splitters 14 having a third inlet opening 3112. The one portion of one of the plurality of liquid conduit splitters 14 is in fluid communication with the one of the plurality of corner flow connectors 16A via yet another of the plurality of adapters 190. The third outlet flow passageway system 3190 further includes another portion of the one of the plurality of liquid conduit splitters 14 having a third outlet opening 3198. The another portion of one of the plurality of liquid conduit splitters 14 is in fluid communication with the another of the plurality of corner flow connectors 16A via further yet another of the plurality of adapters 190. The liquid cooling heat exchange casing 100/300/500 further includes a second liquid plate heat exchanger 60 and a second heat source 80. The cooling fluid is further circulated via the third outlet opening 3198 and the third inlet opening 3112, and the second liquid plate heat exchanger 60 is configured to transfer heat from the second heat source 80.

As further illustrated, the chassis 10 further includes a fourth side 410, next to the third side 310. The fourth side 410 includes a fourth inlet flow passageway system 4110, a fourth outlet flow passageway system 4190, and a fourth radiator 182. The fourth inlet flow passageway system 4110 includes one of the plurality of corner flow connectors 16A having a fourth inlet transition opening 4111, one of the plurality of liquid conduits 11, and the one of the plurality of transitional flow connectors 15B having a fourth inlet flowthrough opening 4119. The fourth outlet flow passageway system 4190 includes the another of the plurality of transitional flow connectors 15B having a fourth outlet flowthrough opening 4191, another of the plurality of liquid conduits 11, and another of the plurality of corner flow connectors 16A having a fourth outlet transition opening 4199. The fourth radiator 182 includes a fourth radiator inlet portion 283 and a fourth outlet portion 288. The fourth inlet portion 283 has a fourth radiator inlet 2831 and the fourth outlet portion 288 has a fourth radiator outlet 2889. The chassis 10 yet further includes a sixth transition side 610, next to the fourth side 410 and the at least a first side 110. The sixth transition side 610 includes a sixth distal transition passageway 6110, and a sixth proximal transition passageway 6190. The sixth distal transition passageway 6110 includes one of the plurality of transition liquid conduits 12. The sixth proximal transition passageway 6190 includes another of the plurality of transition liquid conduits 12. Yet another of the plurality of adapters 190 is mounted to the fourth inlet flowthrough opening 4119, and the fourth radiator 182 is at least mounted to the fourth inlet flow passageway system 4110 via the fourth radiator inlet 2831 and the yet another of the plurality of adapters 190. Yet another of the plurality of adapters 190 is mounted to the one of the plurality of transition liquid conduits 12 and the fourth inlet transition opening 4111, yet another of the plurality of adapters 190 is mounted to the one of the plurality of corner flow connectors 16A and the one of the plurality of liquid conduits 11, yet another of the plurality of adapters 190 is mounted to the one of the plurality of liquid conduits 11 and the one of the plurality of transition liquid conduits 12. The fourth radiator 182 is in fluid communication with the fourth inlet flow passageway system 4110. The one of the plurality of transition liquid conduits 12 is in fluid communication with the one of the plurality of corner flow connectors 16A, the one of the plurality of corner flow connectors 16A is in fluid communication with the one of the plurality of liquid conduits 11, and the one of the plurality of liquid conduits 11 is in fluid communication with the one of the plurality of transition flow connectors 15B. Further yet another of the plurality of adapters 190 is mounted to the fourth outlet flowthrough opening 4191, and the fourth radiator 182 is at least mounted to the fourth outlet flow passageway system 4190 via the fourth radiator outlet 2889 and the further yet another of the plurality of adapters 190. Further yet another of the plurality of adapters 190 is mounted to the another of the plurality of transitional flow connectors 15B and the another of the plurality of liquid conduits 11, further yet another of the plurality of adapters 190 is mounted to the another of the plurality of liquid conduits 11 and the another of the plurality of corner flow connectors 16A and further yet another of the plurality of adapters 190 is mounted to the another of the plurality of corner flow connectors 16A and the another of the plurality of transition liquid conduits 12. The fourth radiator 182 is in fluid communication with the fourth outlet flow passageway system 4190. The another of the plurality of transitional flow connectors 15B is in fluid communication with the another of the plurality of liquid conduits 11. The another of the plurality of liquid conduits 11 is in fluid communication with the another of the plurality of corner flow connectors 16A. The another of the plurality of corner flow connectors 16A is in fluid communication with the another of the plurality of transition liquid conduits 12. The one of the plurality of transition liquid conduits 12 is in fluid communication with the fourth inlet flow passageway system 4110 via the fourth inlet transition opening 4111, and the fourth outlet flow passageway system 4190 is in fluid communication with the another of the plurality of transition liquid conduits 12 via the fourth outlet transition opening 4199. The fourth inlet flow passageway system 4110 further includes one of the plurality of elongated structures 13. The one of the plurality of corner flow connectors 16A is attached to the one of the plurality of elongated structures 13 via yet another of the plurality of adapters 190. The another of the plurality of corner flow connectors 16A is attached to the one of the plurality of elongated structures 13 via further yet another of the plurality of adapters 190. The cooling fluid further flows from the first inlet flow passageway system 1110, through the sixth distal transition passageway 6110, through the fourth inlet flow passageway system 4110, through the fourth radiator 182, through the fourth outlet flow passageway system 4190, through the sixth proximal transition passageway 6190, and to the first outlet flow passageway system 1190.

In the illustrated embodiments, the cooling fluid flows from the first inlet liquid coolant opening 1111, and then through the first inlet flow passageway system 1110 and through the sixth distal transition passageway 6110. From the first inlet flow passageway system 1110, the cooling fluid then flows through the at least one radiator 170 and to the second inlet flow passageway system 2110. From the at least one radiator 170, the cooling fluid flows through the first outlet flow passageway system 1190 and through the first outlet liquid coolant opening 1199, before being circulated back through the first inlet liquid coolant opening 1111. From the sixth distal transition passageway 6110 the cooling fluid flows through the fourth inlet flow passageway system 4110, through the fourth radiator 182, through the fourth outlet flow passageway system 4190, through the sixth proximal transition passageway 6190, through the first outlet flow passageway system 1190, and through the first outlet liquid coolant opening 1199, before also being circulated to the first inlet liquid coolant opening 1111. From the second inlet flow passageway system 2110, the cooling fluid then flows through the second radiator 172 and through the fifth distal transition passageway 5110. From the second radiator 172, the cooling fluid flows through the second outlet flow passageway system 2190, through the first outlet flow passageway system 1190, and through the first outlet liquid coolant opening 1199, before also being circulated to the first inlet liquid coolant opening 1111. From the fifth distal transition passageway 5110, the cooling fluid flows through the third inlet flow passageway system 3110, through the third radiator 870, through the third outlet flow passageway system 3190, and then through the fifth proximal transition passageway 5190 and through the third outlet opening 3198. From the fifth proximal transition passageway 5190, the cooling fluid flows through the second outlet flow passageway system 2190 and through the first outlet flow passageway system 1190, and through the first outlet liquid coolant opening 1199, before also being circulated to the first inlet liquid coolant opening 1111. From the third outlet opening 3198, the cooling fluid is circulated. The cooling fluid flows from the third inlet opening 3112, through the third inlet flow passageway system 3110, through the second radiator 172, through the third outlet flow passageway system 3190, and then through the fifth proximal transition passageway 5190 and through the third outlet opening 3198 as previous.

Figure 8:
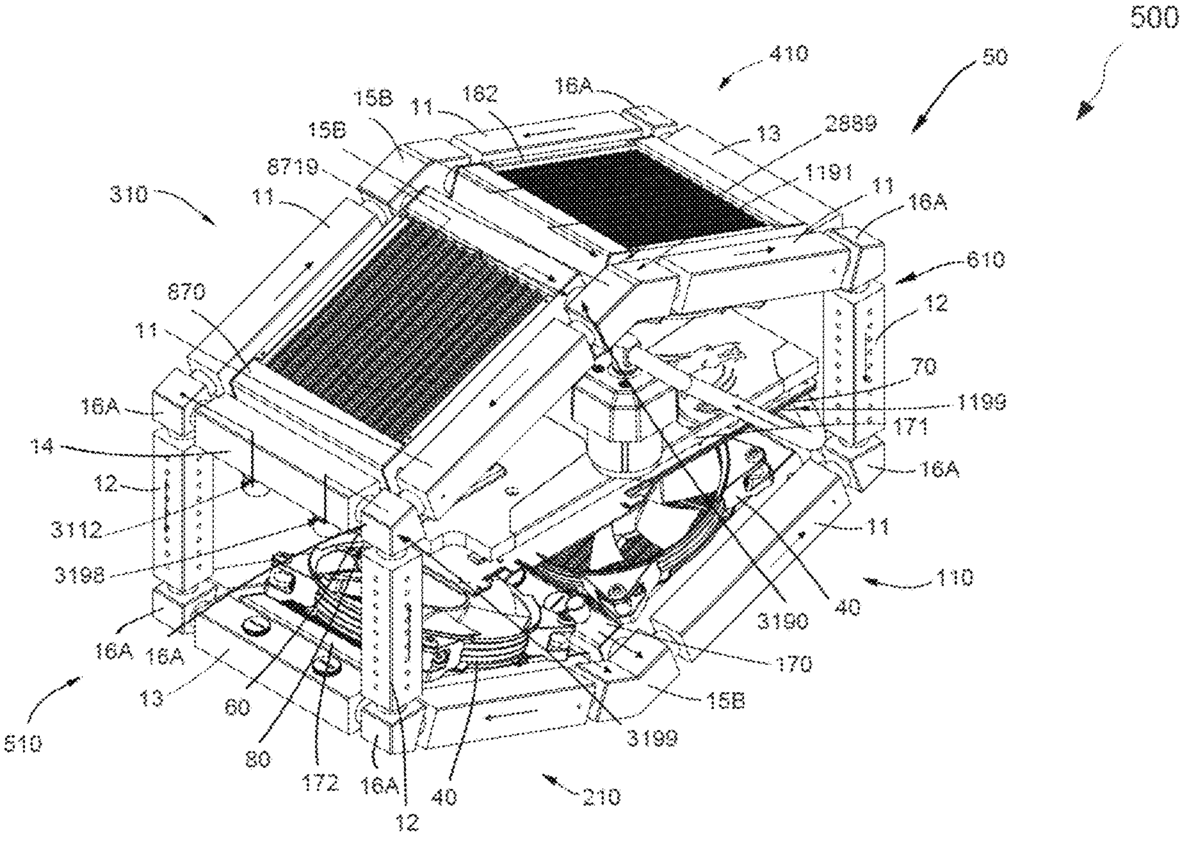
FIG. 8 illustrates a perspective view of yet another liquid cooling heat exchange casing 500, illustrating fluid flow in the liquid cooling heat exchange casing 500 during operation thereof, according to embodiments of the disclosure.

In the illustrated embodiments, the cooling fluid flows from the at least a first side 110, and then through the second side 210 and the sixth side 610. From the second side 210, the cooling fluid flows through the fifth side 510 and then through the third side 310 and is circulated. From the sixth side 610, the cooling fluid flows through the fourth side 410. From the third side 310, the cooling fluid flows back through the second side 210 and back through the at least a first side 110, and from the fourth side 410 the cooling fluid flows back through the sixth side 610 and the back through the at least a first side 110, before being circulated to repeat the flow process again; however, the illustrated embodiments are not limited thereto. FIG. 8 illustrates a perspective view of yet another liquid cooling heat exchange casing 500, illustrating fluid flow in the liquid cooling heat exchange casing 500 during operation thereof, according to embodiments of the disclosure. The difference between the liquid cooling heat exchange casing 500 of FIG. 8 and the liquid cooling heat exchange casing 100 of FIGS. 1 and 7A and 7B is the cooling fluid flow directions via the plurality of transition flow connectors 15B. Thus, the liquid cooling heat exchange casing 500 of FIG. 8 may be best understood with reference to the above, as like numerals designate like components which may not be described again in detail for brevity. As illustrated in FIG. 8, and referring again to the illustrations of FIGS. 1 to 7B, the cooling fluid flows from the at least a first side 110, and then through the fourth side 410 and not also through the second side 210. From the fourth side 410 the cooling fluid flows back through the at least a first side 110, before being circulated to repeat the flow process again. Concurrently, the cooling fluid flows from the third side 310, and then through the second side 210. From the second side 210 the cooling fluid flows back through the third side 310, before being circulated to repeat the flow process again.

As illustrated in FIG. 8, the cooling fluid flows from the at least a first side 110, and then through the fourth side 410 and not also through the second side 210. The plurality of transition flow connectors 15A of FIGS. 1 and 7A and 7B is replaced with the plurality of transition flow connectors 15B, whereby each of the plurality of transition flow connectors 15B is configured for fluid to flow in two flow directions via a dividing panel.

Exemplifying the customizability of the liquid cooling heat exchange casing, the direction of the cooling fluid may be adjusted for an unlimited amount of design set-up choices to achieve efficient cooling performance. Each heat exchange cooling loop including the at least a radiator 170/172/870/182, of each side of the chassis 10/50, may be set-up to be integrally or individually adjustable. Thus, the pump 30 and the at least one fan 40 output power may be individually adjusted in real time, for each heat exchange loop for a most efficient cooling performance of the electronic component system.

Referring again to the illustrations of FIGS. 1, 3, 7A and 7B, and 8, the liquid cooling heat exchange casing 100/300/500 further includes at least one fan 40. The at least one fan 40 is mounted to the at least one radiator 170/172/870/182, and configured to dissipate heat from the at least one radiator 170/172/870/182. In the illustrated embodiments, the amount of the at least one radiator 170/172/870/182 is four and the amount of the at least one fan 40 is four; however, the illustrated embodiments are not limited thereto. The amount of the at least one radiator 170/172/870/182 and the at least one fan 40 may be greater than or less than four and may be equal in amount or not equal in amount, dependent upon a desired design set-up.

Figure 9:
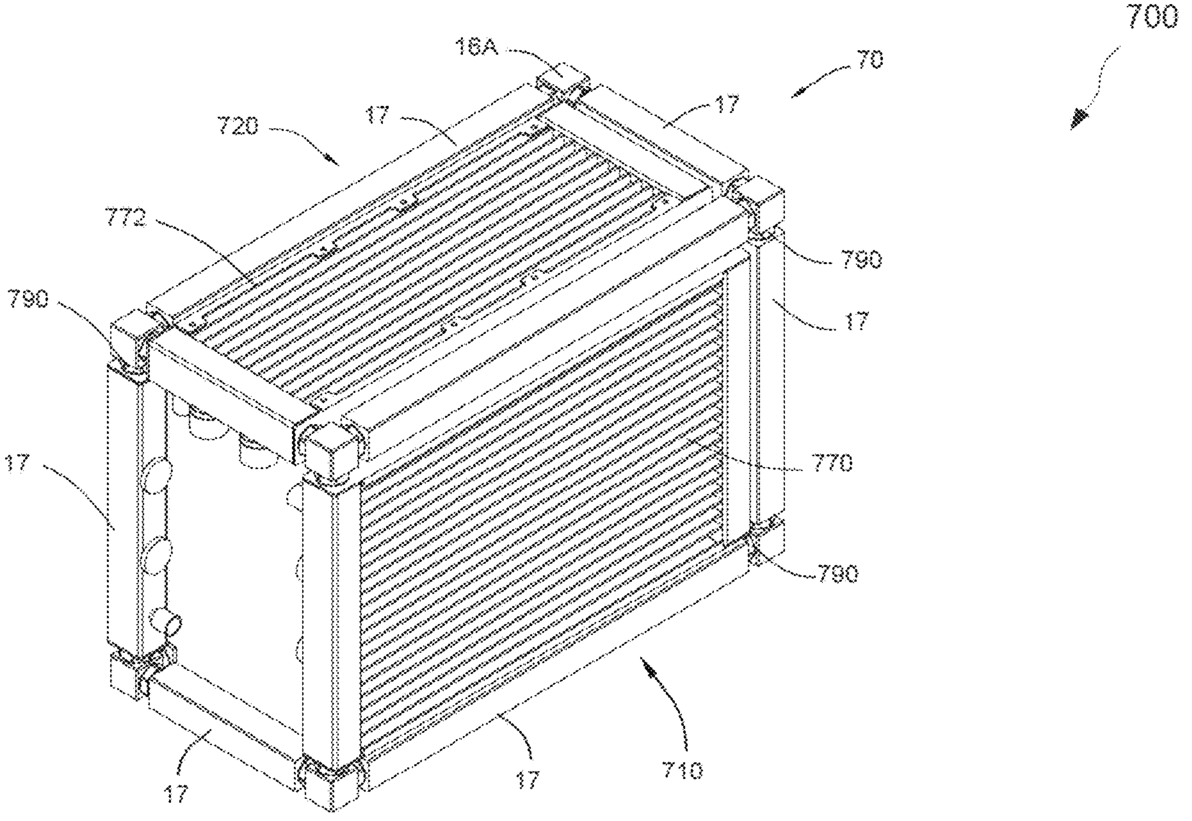
FIG. 9 illustrates a perspective view of further yet another liquid cooling heat exchange casing, according to disclosed embodiments.

In the illustrated embodiments, the liquid cooling heat exchange casing 100/300/500 includes at least a first side 110, a second side 210, a third side 310, and a fourth side 410, having at least a radiator 170, a second radiator 172, a third radiator 870, and a fourth radiator 182 mounted thereon, respectively, and at least one fan 40 mounted to the at least a radiator 170, a second radiator 172, a third radiator 870, and a fourth radiator 182, respectively, and a fifth side 510, and a sixth side 610, and two open sides; however, the illustrated embodiments are not limited thereto. Unlimited design set-up flexibility may be achieved, as the plurality of adapters 190, liquid tight, connect any combination and amount of the plurality of liquid conduit splitters 14, plurality of corner flow connectors 16A, plurality of liquid conduits 11, plurality of transition flow connectors 15A/15B, plurality of elongated structures 13, and plurality of transition liquid conduits 12 thereamong, forming unlimited choices of casing shapes and/or sizes. FIG. 9 illustrates a perspective view of further yet another liquid cooling heat exchange casing 700, according to disclosed embodiments. As illustrated in FIG. 9, and referring again to FIGS. 1 to 4B, and 6A and 6B, the liquid cooling heat exchange casing 700 includes a chassis 70 having at least a first side 710, a second side 720 next to the first side 710, and four open sides. The at least a first side 710 includes at least one radiator 770 and the second side 710 includes a second radiator 772. The at least one radiator 770 and the second radiator 772 are both directly connected to tubes (not shown) via radiator outlets (not shown) and inlets (not shown), respectively, whereby a pump (not shown), in fluid communication with at least a liquid plate heat exchanger (not shown) in thermal communication with a heat source (not shown), circulates liquid coolant through the at least one radiator 770 and the second radiator 772, respectively, dissipating heat from the heat source. The chassis 70 further includes nine plurality of liquid conduits 17; however, the illustrated embodiments are not limited thereto. As the design set-up does not require a plurality of liquid conduit splitters having openings, a plurality of elongated structures or a plurality of transition liquid conduits, or any combination thereof, may replace any one or all of the plurality of liquid conduits 17, exemplifying the customizability represented by the liquid cooling heat exchange casing 700. The chassis 70 further includes a plurality of adapters 790, and eight plurality of corner flow connectors 16A. The chassis 70 yet further includes a mounting system having at least a mounting plate (not shown), and/or an expansion card slot (not shown), and a plurality of fastener holes (not shown). The plurality of fastener holes is disposed on at least one side of the plurality of liquid conduits 17, whereby the at least a mounting plate is mounted to the plurality of fastener holes, and/or an expansion card slot is disposed on at least two of the plurality of liquid conduits 17. The mounting system is configured to mount at least one of a motherboard, an expansion card, a pump, a reservoir, a liquid plate heat exchanger, a heat source, an electronic component or any combination of the foregoing, thereto.

Figure 10A:
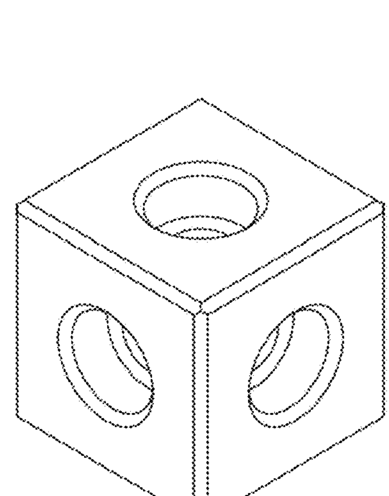
FIG. 10A illustrates a perspective view of yet another corner flow connector, according to disclosed embodiments.
Figure 10B:
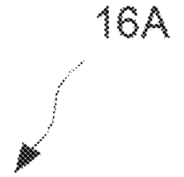
FIG. 10B is a cross-section view of the yet another corner flow connector of FIG. 10A, according to disclosed embodiments.
Figure 10B:
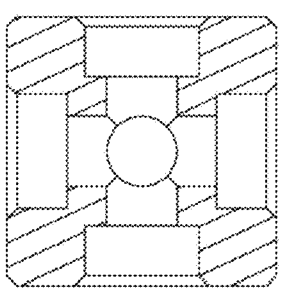

In the illustrated embodiments of FIGS. 1, 3, and 6A and 6B, a shape of the plurality of corner flow connectors 16A is unequal height cube shape and an amount of the openings is three; however, the illustrated embodiments are not limited thereto. Referring again to FIG. 9, and FIGS. 1, 3, and 6A and 6B, a shape of the plurality of corner flow connectors 16A of FIG. 9 is a cube shape and an amount of the openings is three. FIG. 10A illustrates a perspective view of yet another corner flow connector, according to disclosed embodiments. FIG. 10B is a cross-section view of the yet another corner flow connector of FIG. 10A, according to disclosed embodiments. As illustrated in FIGS. 10A and 10B, and referring again to FIG. 9, and FIGS. 1, 3, and 6A and 6B, a shape of the plurality of corner flow connectors 16A is cube shaped and an amount of the openings is six, offering unlimited design set-up flexibility for a chassis of a liquid cooling heat exchange casing.

In the illustrated embodiments of FIGS. 1, 3, and 7A to 8, one of the plurality of adapters 190 is mounted to the first inlet flowthrough opening 1119 and another of the plurality of adapters 190 is mounted to the outlet flowthrough opening 1191, and the at least one radiator 170 is at least mounted to the first inlet flow passageway system 1110 and first outlet flow passageway system 1190 via the radiator inlet 1711 and the one of the plurality of adapters 190 and the radiator outlet 1719 and the another of the plurality of adapters 190, respectively, whereby the at least one radiator 170 is in fluid communication with the first inlet flow passageway system 1110 and the first outlet flow passageway 1190, respectively; however, the illustrated embodiments are not limited thereto. In the embodiments, one of the plurality of adapters 190 may be mounted to an inlet flowthrough opening and another of the plurality of adapters 190 may be mounted to an outlet flowthrough opening of a liquid conduit or a corner flow connector. As long as the at least one radiator 170 is at least mounted to a first inlet flow passageway system and outlet flow passageway system via a radiator inlet and a radiator outlet, respectively.

A liquid cooling heat exchange casing 100/300/500/700 for mounting and disengagement of substrates, electronic components, and heat exchange apparatuses to the substrates or electronic components is provided. As illustrated, the liquid cooling heat exchange casing 100/300/500/700 may include a chassis 10/50/70 having a plurality of liquid conduit splitters 14, a plurality of corner flow connectors 16A, a plurality of liquid conduits 11, a plurality of transition flow connectors 15A/15B, a plurality of elongated structures 13, a plurality of transition liquid conduits 12, a plurality of adapters, at least one radiator 170, and a pump 30. Each of the plurality of liquid conduit splitters 14 is configured for fluid to flow in two separate flow directions via a dividing panel. Each of the plurality of corner flow connectors 16A is configured for fluid to flow in at least one flow direction. Each of the plurality of liquid conduits 11 is configured for fluid to flow therethrough. Each of the plurality of transition flow connectors 15A/15B is configured for fluid to flow in at least one direction. Each of the plurality of elongated structures 13 is configured for fluid to flow therethrough or for fluid to not flow therethrough. Each of the plurality of transition liquid conduits 12 is configured for fluid to flow in at least one flow direction. The plurality of adapters 190, liquid tight connect the plurality of liquid conduit splitters 14, the plurality of corner flow connectors 16A, the plurality of liquid conduits 11, the plurality of transition flow connectors 15A/15B, the plurality of elongated structures 13, the plurality of transition liquid conduits 12, and the at least one radiator 170 thereamong, as a part of the chassis 10/50/70 and as part of a heat exchange apparatus dissipating heat from heat sources mounted to the chassis 10/50/70, whereby liquid tubes are not required.

As illustrated, one portion of one of the plurality of liquid conduit splitters 14, one of the plurality of corner flow connectors 16A, one of the plurality of liquid conduits 11, and one of the plurality of transition liquid conduits 12, liquid tight connected via the plurality of adapters 190, define a first inlet flow passageway system 1110 of at least at least a first side 110 of the chassis 10/50. The at least a first side 110 further includes the at least one radiator 170 in fluid communication with the first inlet flow passageway system 1110. The one portion of one of the plurality of liquid conduit splitters 14 has a first inlet liquid coolant opening 1111 and the one of the plurality of transition flow connectors 15A/15B has a first inlet flowthrough opening 1119. The one portion of one of the plurality of liquid conduit splitters 14 is in fluid communication with the one of the plurality of corner flow connectors 16A, the one of the plurality of corner flow connectors 16A is in fluid communication with the one of the plurality of liquid conduits 11, and the one of the plurality of liquid conduits 11 is in fluid communication with the one of the plurality of transition flow connectors 15A/15B.

As further illustrated, the at least one radiator 170 includes a radiator inlet portion 171 having a radiator inlet 1711. One of the plurality of adapters 190 is mounted to the first inlet flowthrough opening 1119, and the at least one radiator 170 is at least mounted to the first inlet flow passageway system 1110 via the radiator inlet 1711 and the one of the plurality of adapters 190, whereby the at least one radiator 170 is in fluid communication with the first inlet flow passageway system 1110.

As illustrated, another of the plurality of transition flow connectors 15A/15B, another of the plurality of liquid conduits 11, another of the plurality of corner flow connectors 16A, and another portion of the one of the plurality of liquid conduit splitters 14, liquid tight connected via the plurality of adapters 190, define a first outlet flow passageway system 1190 of the at least at least a first side 110 of the chassis 10/50. The at least one radiator 170 is furthermore in fluid communication with the first outlet flow passageway system 1190. The another of the plurality of transition flow connectors 15A/15B has a first outlet flowthrough opening 1191 and the another portion of the one of the plurality of liquid conduit splitters 14 has a first outlet liquid coolant opening 1199. The another of the plurality of transition flow connectors 15A/15B is in fluid communication with the another of the plurality of liquid conduits 11. The another of the plurality of liquid conduits 11 is in fluid communication with the another of the plurality of corner flow connectors 16A, and the another of the plurality of corner flow connectors 16A is in fluid communication with the another portion of the one of the plurality of liquid conduit splitters 14.

As further illustrated, the at least one radiator 170 further includes a radiator outlet portion 179 having a radiator outlet 1719. Another of the plurality of adapters 190 is mounted to the first outlet flowthrough opening 1191, and the at least one radiator 170 is at least mounted to the first outlet flow passageway system 1190 via the radiator outlet 1719 and the another of the plurality of adapters 190, whereby the at least one radiator 170 is further in fluid communication with the first outlet flow passageway system 1190.

In the illustrated embodiments, the pump 30 circulates liquid coolant throughout the liquid cooling heat exchange casing 100/300/500 via the first outlet liquid coolant opening 1199 and the first inlet liquid coolant opening 1111, whereby a cooling fluid flows from the first inlet liquid coolant opening 1111, through the first inlet flow passageway system 1110, through the at least one radiator 170, through the first outlet flow passageway system 1190, and to the first outlet liquid coolant opening 1199, before being circulated to repeat the flow process again.

In the illustrated embodiments, risk of leakage due to pressure inside of tubes of heat exchange apparatuses mounted to chassis' of casings is decreased. Required length of tubes for operation of the liquid cooling system of the liquid cooling heat exchange casing 100/300/500 is decreased, as the cooling fluid may flow through the plurality of liquid conduit splitters 14, the plurality of corner flow connector 16A, the plurality of liquid conduits 11, the plurality of transition flow connectors 15A/15B, the plurality of elongated structures 13, and the plurality of transition liquid conduits 12 of the chassis 10/50. Moreover, decreasing the length of tubes, not only decreases the possibility of bent tubes or kinked tubes from occurring, but also decreases the area profile required for tubes in the casing. Slimmer casing profiles may be achieved, more electronic components may be installed in place of the lengthy tubes, increasing computer power, or the freed-up area profile may assure more efficient cooling of the electronic component system.

Furthermore, in the illustrated embodiments, limited design set-up choices of electronic component systems and heat exchange apparatuses therein is eliminated. Unlimited design set-up flexibility is achieved, as the plurality of adapters 190, liquid tight, connect any combination and amount of the plurality of liquid conduit splitters 14, the plurality of corner flow connector 16A, the plurality of liquid conduits 11, the plurality of transition flow connectors 15A/15B, the plurality of elongated structures 13, and the plurality of transition liquid conduits 12 thereamong, forming unlimited choices of casing shapes and/or sizes. The plurality of fastener holes 111, disposed on at least two of the plurality of liquid conduits 11, the plurality of elongated structures 13, and/or the plurality of transition liquid conduits 12 of the chassis 10/50, having shapes corresponding to desired mounting planes, and the mounting plate (not shown), mounted to the plurality of fastener holes 111, and the expansion cards (not shown), mounted to the expansion card slots (not shown), offer mixing and matching of proprietary or non-proprietary motherboards, expansion cards, pumps, reservoirs, liquid plate heat exchangers, heat sources, electronic component or any combination of the foregoing to the chassis 10/50, in any desired plane or design set-up for maximum flexibility and heat dissipating efficiency.

Additionally, in the illustrated embodiments, the plurality of liquid conduit splitters 14 of the chassis 10/50 may be assembled on any desired side or area of the chassis 10/50 for connection to the pump 30, circulating liquid coolant throughout the liquid cooling system. The pump 30 may be connected to a liquid plate heat exchanger 50 mounted to a heat source 70, transporting heat away from the heat source 70. The flexibility allows for achievement of efficient cooling performance for an unlimited amount of design set-up choices.

Even furthermore, in the illustrated embodiments, powerful electronic component systems may be achieved. The plurality of transition flow connectors 15A/15B having the flowthrough openings of the chassis 10/50 allow for mounting of a radiator to each side of the chassis 10/50. Furthermore, the plurality of liquid conduit splitters 14 of the chassis 10/50 may be assembled on any desired side or area of the chassis 10/50, for connection to any amount of liquid plate heat exchangers, as an example, the second liquid plate heat exchanger 60, mounted to heat sources, as an example, the second heat source 80, transporting heat away from the heat sources.

Therefore, embodiments disclosed herein are well adapted to attain the ends and advantages mentioned as well as those that are inherent therein. The particular embodiments disclosed above are illustrative only, as the embodiments disclosed may be modified and practiced in different but equivalent manners apparent to those of ordinary skill in the relevant art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

What is claimed is:

1. A liquid cooling heat exchange casing, comprising:

a chassis, including a first side and a second side adjacent to the first side, the first side comprising:

a first inlet flow passageway system having a first inlet liquid coolant opening and a first inlet flowthrough opening;

a first outlet flow passageway system having a first outlet liquid coolant opening and a first outlet flowthrough opening; and a first radiator including a first radiator inlet portion and a first radiator outlet portion, the first radiator inlet portion having a first radiator inlet and the first radiator outlet portion having a first radiator outlet;

the second side comprising:

a second inlet flow passageway system having a second inlet transition opening and a second inlet flowthrough opening:

a second outlet flow passageway system having a second outlet transition opening and a second outlet flowthrough opening; and a second radiator including a second radiator inlet portion and a second radiator outlet portion, the second inlet radiator portion having a second radiator inlet and the second radiator outlet portion having a second radiator outlet; and a plurality of adapters, wherein a first of the plurality of adapters is mounted to the first inlet flowthrough opening, and the first radiator is at least mounted to the first inlet flow passageway system via the first radiator inlet and the first of the plurality of adapters, whereby the first radiator is in fluid communication with the first inlet flow passageway system, and wherein another a second of the plurality of adapters is mounted to the first outlet flowthrough opening, and the first radiator is at least mounted to the first outlet flow passageway system via the first radiator outlet and the second of the plurality of adapters, whereby the first radiator is in fluid communication with the first outlet flow passageway system, wherein a third of the plurality of adapters is mounted to the second inlet flowthrough opening, and the second radiator is at least mounted to the second inlet flow passageway system via the second radiator inlet and the third of the plurality of adapters, whereby the second radiator is in fluid communication with the second inlet flow passageway system, wherein a fourth of the plurality of adapters is mounted to the second outlet flowthrough opening, and the second radiator is at least mounted to the second outlet flow passageway system via the second radiator outlet and the fourth of the plurality of adapters, whereby the second radiator is in fluid communication with the second outlet flow passageway system, wherein the first inlet flow passageway system is in fluid communication with the second inlet flow passageway system via the second inlet transition opening and the second outlet flow passageway system is in fluid communication with the first outlet flow passageway system via the second outlet transition opening, whereby a cooling fluid configured to flows from the first inlet liquid coolant opening, through the first inlet flow passageway system, through the first radiator, through the first outlet flow passageway system, and to the first outlet liquid coolant opening, before being circulated to repeat the flow process again, and whereby the cooling fluid further flows from the first inlet flow passageway system, through the second inlet flow passageway system, through the second radiator, through the second outlet flow passageway system, and to the first outlet flow passageway system.

2. The liquid cooling heat exchange casing of claim 1, further comprising a pump, the pump configured to circulate the cooling fluid via the first outlet liquid coolant opening and the first inlet liquid coolant opening.

3. The liquid cooling heat exchange casing of claim 2, further comprising at least one liquid plate heat exchanger and at least one heat source, the at least one liquid plate heat exchanger is in fluid communication with the pump, and the at least one liquid plate heat exchanger is configured to transfer heat from the heat source.

4. The liquid cooling heat exchange casing of claim 1, wherein the chassis further includes a third side, the third side comprising:

a third inlet flow passageway system having a third inlet transition opening and a third inlet flowthrough opening;

a third outlet flow passageway system having a third outlet transition opening and a third outlet flowthrough opening;

a third radiator including a third radiator inlet portion and a third radiator outlet portion, the third inlet radiator portion having a third radiator inlet and the third radiator outlet portion having a third radiator outlet, wherein a fifth of the plurality of adapters is mounted to the third inlet flowthrough opening, and the third radiator is at least mounted to the third inlet flow passageway system via the third radiator inlet and the fifth of the plurality of adapters, whereby the third radiator is in fluid communication with the third inlet flow passageway system, wherein a sixth of the plurality of adapters is mounted to the third outlet flowthrough opening, and the third radiator is at least mounted to the third outlet flow passageway system via the third radiator outlet and the sixth of the plurality of adapters, whereby the third radiator is in fluid communication with the third outlet flow passageway system, and wherein the second inlet flow passageway system is in fluid communication with the third inlet flow passageway system via the third inlet transition opening via the third inlet transition opening and the third outlet flow passageway system is in fluid communication with the second outlet flow passageway system via the second proximal, whereby the cooling fluid further flows from the second inlet flow passageway system, through the third inlet flow passageway system, through the third radiator, through the third outlet flow passageway system, and to the second outlet flow passageway system.

5. The liquid cooling heat exchange casing of claim 4, wherein the third inlet flow passageway system further comprises a third inlet opening and the third outlet flow passageway system further comprises a third outlet opening, and the liquid cooling heat exchange casing further comprises a second liquid plate heat exchanger and a second heat source, whereby the cooling fluid is further circulated via the third outlet opening and the third inlet opening, and the second liquid plate heat exchanger is configured to transfer heat from the second heat source.

6. The liquid cooling heat exchange casing of claim 4, wherein the chassis further includes a fourth side adjacent to the third side, the fourth side comprising:

a fourth inlet flow passageway system having a fourth inlet opening and a fourth inlet flowthrough opening;

a fourth outlet flow passageway system having a fourth outlet opening and a fourth outlet flowthrough opening;

a fourth radiator including a fourth radiator inlet portion and a fourth radiator outlet portion, the fourth inlet radiator portion having a fourth radiator inlet and the fourth radiator outlet portion having a fourth radiator outlet, wherein a seventh of the plurality of adapters is mounted to the fourth inlet flowthrough opening, and the fourth radiator is at least mounted to the fourth inlet flow passageway system via the fourth radiator inlet and the seventh of the plurality of adapters, whereby the fourth radiator is in fluid communication with the fourth inlet flow passageway system, wherein an eighth of the plurality of adapters is mounted to the fourth outlet flowthrough opening, and the fourth radiator is at least mounted to the fourth outlet flow passageway system via the fourth radiator outlet and the eighth of the plurality of adapters, whereby the fourth radiator is in fluid communication with the fourth outlet flow passageway system, and wherein the first inlet flow passageway system is in fluid communication with the fourth inlet flow passageway system and the fourth outlet flow passageway system is in fluid communication with the first outlet flow passageway system, whereby the cooling fluid further flows from the first inlet flow passageway system, through the fourth inlet flow passageway system, through the fourth radiator, through the fourth outlet flow passageway system, and to the first outlet passageway system.

7. The liquid cooling heat exchange casing of claim 6, wherein the chassis further comprises a plurality of transition liquid conduits and a mounting system, the first inlet flow passageway system is in fluid communication with the fourth inlet flow passageway system via the plurality of transition liquid conduits and the fourth outlet flow passageway system is in fluid communication with the first outlet flow passageway system via the plurality of transition liquid conduits, the mounting system includes at least one mounting plate, an expansion card slot, and a plurality of fastener holes, the plurality of fastener holes disposed on at least one side of each of the plurality of transition liquid conduits, whereby the at least one mounting plate is mounted to the plurality of fastener holes disposed on at least two of the plurality of transition liquid conduits, and the expansion card slot is disposed on at least two of the plurality of transition liquid conduits, and the mounting system is configured to mount at least one of a motherboard, an expansion card, a pump, a liquid plate heat exchanger, a heat source, an electronic component or any combination of the foregoing, thereto.

8. The liquid cooling heat exchange casing of claim 1, wherein the chassis further comprises, a plurality of liquid conduit splitters, a plurality of corner flow connectors, a plurality of liquid conduits, a plurality of transition flow connectors, a plurality of elongated structures, and a plurality of transition liquid conduits, each of the plurality of liquid conduit splitters is configured for the cooling fluid to flow in two separate flow directions via a dividing panel, each of the plurality of corner flow connectors configured for the cooling fluid to flow in at least one flow direction, each of the plurality of liquid conduits configured for the cooling fluid to flow therethrough, each of the transition flow connectors configured for the cooling fluid to flow in at least one flow direction, and each of the plurality of transition liquid conduits configured for the cooling fluid to flow therethrough.

9. The liquid cooling heat exchange casing of claim 8, wherein the first inlet flow passageway system further includes a first of the plurality of corner flow connectors, a first of the plurality of liquid conduits, and a first of the plurality of transition flow connectors having the first inlet flowthrough opening, the first of the plurality of corner flow connectors in fluid communication with the first of the plurality of liquid conduits via a nineth of the plurality of adapters, the first of the plurality of liquid conduits in fluid communication with the first of the plurality of transition flow connectors via a tenth of the plurality of adapters, and the first outlet flow passageway system further includes a second of the plurality of transition flow connectors having the first outlet flowthrough opening, a second of the plurality of liquid conduits, and a second of the plurality of corner flow connectors, the second of the plurality of corner flow connectors in fluid communication with the second of the plurality of liquid conduits via an eleventh of the plurality of adapters, the second of the plurality of liquid conduits in fluid communication with the second of the plurality of transition flow connectors via a twelfth of the plurality of adapters, and wherein the first inlet flow passageway system further includes a first portion of a first of the plurality of liquid conduit splitters having the first inlet liquid coolant opening, the first portion of the first of the plurality of liquid conduit splitters in fluid communication with the first of the plurality of corner flow connectors via a thirteenth of the plurality of adapters, and the first outlet flow passageway system further includes a second portion of the first of the plurality of liquid conduit splitters having the first inlet liquid coolant opening, the second portion of the first of the plurality of liquid conduit splitters in fluid communication with the second of the plurality of corner flow connectors via a fourteenth of the plurality of adapters.

10. The liquid cooling heat exchange casing of claim 9, further comprising a pump, the pump is configured to circulate the cooling fluid via the first outlet liquid coolant opening and the first inlet liquid coolant opening.

11. The liquid cooling heat exchange casing of claim 10, further comprising at least one liquid plate heat exchanger and at least one heat source, the at least one liquid plate heat exchanger in fluid communication with the pump, the at least one liquid plate heat exchanger is configured to transfer heat from the heat source.

12. The liquid cooling heat exchange casing of claim 9, wherein the second outlet flow passageway system of the second side includes the first of the plurality of transition flow connectors, a third of the plurality of liquid conduits, and a third of the plurality of corner flow connectors, the first of the plurality of transition flow connectors includes the second outlet transition opening and the second outlet flowthrough opening, wherein the second inlet flow passageway system of the second side includes the second of the plurality of transition flow connectors, a fourth of the plurality of liquid conduits, and a fourth of the plurality of corner flow connectors, the second of the plurality of transition flow connectors includes the second inlet transition opening and the second inlet flowthrough opening, wherein a fifteenth of the plurality of adapters is mounted to the first of the plurality of transition flow connectors and the third of the plurality of liquid conduits, and a sixteenth of the plurality of adapters is mounted to the third of the plurality of liquid conduits and the third of the plurality of corner flow connectors, and whereby the first of the plurality of transition flow connectors is in fluid communication with the third of the plurality of liquid conduits and the third of the plurality of liquid conduits is in fluid communication with the third of the plurality of corner flow connectors, a seventeenth of the plurality of adapters is mounted to the second of the plurality of transition flow connectors and the fourth of the plurality of liquid conduits, and an eighteenth of the plurality of adapters is mounted to the fourth of the plurality of liquid conduits and the fourth of the plurality of corner flow connectors, and whereby the second of the plurality of transition flow connectors is in fluid communication with the fourth of the plurality of liquid conduits and the fourth of the plurality of liquid conduits is in fluid communication with the fourth of the plurality of corner flow connectors, and wherein the second inlet flow passageway system further includes a first of the plurality of elongated structures, the third of the plurality of corner flow connectors attached to the first of the plurality of elongated structures via a nineteenth of the plurality of adapters, and the fourth of the plurality of corner flow connectors attached to the first of the plurality of elongated structures via a twentieth of the plurality of adapters.

13. The liquid cooling heat exchange casing of claim 12, wherein the chassis further includes a fifth transition side adjacent to the second side, the fifth transition side comprising:

a distal transition passageway including a first of the plurality of transition liquid conduits; and a proximal transition passageway including a second of the plurality of transition liquid conduits, and wherein the chassis yet further includes a third side adjacent to the fifth transition side, the third side comprising:

a third inlet flow passageway system including a fifth of the plurality of corner flow connectors having a third inlet transition opening, a fifth of the plurality of liquid conduits, and a third of the plurality of transitional flow connectors having a third inlet flowthrough opening;

a third outlet flow passageway system including a fourth of the plurality of transitional flow connectors having a third outlet flowthrough opening, a sixth of the plurality of liquid conduits, and a sixth of the plurality of corner flow connectors having a third outlet transition opening; and a third radiator including a third radiator inlet portion and a third radiator outlet portion, the third inlet radiator portion having a third radiator inlet and the third radiator outlet portion having a third radiator outlet, wherein a fifth of the plurality of adapters is mounted to the third inlet flowthrough opening, and the third radiator is at least mounted to the third inlet flow passageway system via the third radiator inlet and the fifth of the plurality of adapters, and wherein a twenty-fist of the plurality of adapters is mounted to the first of the plurality of transition liquid conduits and the third inlet transition opening, a twenty-second of the plurality of adapters is mounted to the fifth of the plurality of corner flow connectors and the fifth of the plurality of liquid conduits, and a twenty-third of the plurality of adapters is mounted to the fifth of the plurality of liquid conduits and the third of the plurality of transition flow connectors, whereby the third radiator is in fluid communication with the third inlet flow passageway system, and whereby the first of the plurality of transition liquid conduits is in fluid communication with the fifth of the plurality of corner flow connectors, the fifth of the plurality of corner flow connectors is in fluid communication with the fifth of the plurality of liquid conduits, and the fifth of the plurality of liquid conduits is in fluid communication with the third of the plurality of transition flow connectors, wherein a sixth of the plurality of adapters is mounted to the third outlet flowthrough opening, and the third radiator is at least mounted to the third outlet flow passageway system via the third radiator outlet and the sixth of the plurality of adapters, and wherein a twenty-fourth of the plurality of adapters is mounted to the fourth of the plurality of transitional flow connectors and the sixth of the plurality of liquid conduits, a twenty-fifth of the plurality of adapters is mounted to the sixth of the plurality of liquid conduits and the sixth of the plurality of corner flow connectors and a twenty-sixth of the plurality of adapters is mounted to the sixth of the plurality of corner flow connectors and the second of the plurality of transition liquid conduits, whereby the third radiator is in fluid communication with the third outlet flow passageway system, and whereby the fourth of the plurality of transitional flow connectors is in fluid communication with the sixth of the plurality of liquid conduits, the sixth of the plurality of liquid conduits is in fluid communication with the sixth of the plurality of corner flow connectors, and the sixth of the plurality of corner flow connectors is in fluid communication with the second of the plurality of transition liquid conduits, wherein the first of the plurality of transition liquid conduits is in fluid communication with the third inlet flow passageway system via the third inlet transition opening, and the third outlet flow passageway system is in fluid communication with the second of the plurality of transition liquid conduits via the third outlet transition opening, whereby the cooling fluid further flows from the second inlet flow passageway system, through the distal transition passageway, through the third inlet flow passageway system, through the third radiator, through the third outlet flow passageway system, through the proximal transition passageway, and the second outlet flow passageway system.

14. The liquid cooling heat exchange casing of claim 13, wherein the third inlet flow passageway system further comprises a first portion of a second of the plurality of liquid conduit splitters having a third inlet opening, the first portion of the second of the plurality of liquid conduit splitters in fluid communication with the fifth of the plurality of corner flow connectors via a twenty-seventh of the plurality of adapters, and the third outlet flow passageway system further includes a second portion of the second of the plurality of liquid conduit splitters having a third outlet opening, the second portion of the second of the plurality of liquid conduit splitters in fluid communication with the another of the plurality of corner flow connectors via a twenty-eighth of the plurality of adapters, and the liquid cooling heat exchange casing further includes a second liquid plate heat exchanger and a second heat source, whereby the cooling fluid is further circulated via the third outlet opening and the third inlet opening, and the second liquid plate heat exchanger is configured to transfer heat from the second heat source.

15. The liquid cooling heat exchange casing of claim 13, wherein the chassis further includes a fourth side adjacent to the third side, the fourth side comprising:

a fourth inlet flow passageway system including a seventh of the plurality of corner flow connectors having a fourth inlet transition opening, a seventh of the plurality of liquid conduits, and the third of the plurality of transitional flow connectors having a fourth inlet flowthrough opening;

a fourth outlet flow passageway system including the fourth of the plurality of transitional flow connectors having a fourth outlet flowthrough opening, an eighth of the plurality of liquid conduits, and an eighth of the plurality of corner flow connectors having a fourth outlet transition opening; and a fourth radiator including a fourth radiator inlet portion and a fourth radiator outlet portion, the fourth inlet radiator portion having a fourth radiator inlet and the fourth radiator outlet portion having a fourth radiator outlet, and wherein the chassis yet further includes a sixth transition side, next to the fourth side and the at least a first side, the sixth transition side comprising:

a distal transition passageway including a third of the plurality of transition liquid conduits; and a proximal transition passageway including a fourth of the plurality of transition liquid conduits, wherein a seventh of the plurality of adapters is mounted to the fourth inlet flowthrough opening, and the fourth radiator is at least mounted to the fourth inlet flow passageway system via the fourth radiator inlet and the seventh of the plurality of adapters, and wherein a twenty-ninth of the plurality of adapters is mounted to the third of the plurality of transition liquid conduits and the fourth inlet transition opening, a thirtieth of the plurality of adapters is mounted to the seventh of the plurality of corner flow connectors and the seventh of the plurality of liquid conduits, a thirty-first of the plurality of adapters is mounted to the seventh of the plurality of liquid conduits and the third of the plurality of transition liquid conduits, whereby the fourth radiator is in fluid communication with the fourth inlet flow passageway system, and whereby the third of the plurality of transition liquid conduits is in fluid communication with the seventh of the plurality of corner flow connectors, the seventh of the plurality of corner flow connectors is in fluid communication with the seventh of the plurality of liquid conduits, and the seventh of the plurality of liquid conduits is in fluid communication with the third of the plurality of transition flow connectors, wherein an eighth of the plurality of adapters is mounted to the fourth outlet flowthrough opening, and the fourth radiator is at least mounted to the fourth outlet flow passageway system via the fourth radiator outlet and the eighth of the plurality of adapters, and wherein a thirty-second of the plurality of adapters is mounted to the fourth of the plurality of transitional flow connectors and the eighth of the plurality of liquid conduits, a thirty-third of the plurality of adapters is mounted to the eighth of the plurality of liquid conduits and the eighth of the plurality of corner flow connectors and a thirty-fourth of the plurality of adapters is mounted to the eighth of the plurality of corner flow connectors and the fourth of the plurality of transition liquid conduits, whereby the fourth radiator is in fluid communication with the fourth outlet flow passageway system, and whereby the fourth of the plurality of transitional flow connectors is in fluid communication with the eighth of the plurality of liquid conduits, the eighth of the plurality of liquid conduits is in fluid communication with the eighth of the plurality of corner flow connectors, and the eighth of the plurality of corner flow connectors is in fluid communication with the fourth of the plurality of transition liquid conduits, wherein the third of the plurality of transition liquid conduits is in fluid communication with the fourth inlet flow passageway system via the fourth inlet transition opening, and the fourth outlet flow passageway system is in fluid communication with the fourth of the plurality of transition liquid conduits via the fourth outlet transition opening, wherein the fourth inlet flow passageway system further includes a second of the plurality of elongated structures, the seventh of the plurality of corner flow connectors attached to the one of the plurality of elongated structures via a thirty-fifth of the plurality of adapters, and the eighth of the plurality of corner flow connectors attached to the second of the plurality of elongated structures via a thirty-sixth of the plurality of adapters, and whereby the cooling fluid further flows from the first inlet flow passageway system, through the distal transition passageway, through the fourth inlet flow passageway system, through the fourth radiator, through the fourth outlet flow passageway system, through the proximal transition passageway, and to the first outlet flow passageway system.

16. The liquid cooling heat exchange casing of claim 15, wherein the chassis further includes a mounting system including at least one mounting plate, an expansion card slot, and a plurality of fastener holes, the plurality of fastener holes disposed on at least one side of each of the plurality of transition liquid conduits, whereby the at least one mounting plate is mounted to the plurality of fastener holes disposed on at least two of the plurality of transition liquid conduits, and the expansion card slot is disposed on at least two of the plurality of transition liquid conduits, and the mounting system is configured to mount at least one of a motherboard, an expansion card, a pump, a liquid plate heat exchanger, a heat source, an electronic component or any combination of the foregoing, thereto.

17. The liquid cooling heat exchange casing of claim 1, further comprising at least one fan, the at least one fan configured to dissipate heat from the at least one radiator, the at least one fan mounted to the at least one radiator.

18. The liquid cooling heat exchange casing of claim 17, wherein the amount of the at least one fan is four.

* * * * *